United States Patent
Lakin

(10) Patent No.: US 7,138,889 B2
(45) Date of Patent: Nov. 21, 2006

(54) SINGLE-PORT MULTI-RESONATOR ACOUSTIC RESONATOR DEVICE

(75) Inventor: Kenneth Meade Lakin, Redmond, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 102 days.

(21) Appl. No.: 11/088,155

(22) Filed: Mar. 22, 2005

(65) Prior Publication Data

US 2006/0214747 A1 Sep. 28, 2006

(51) Int. Cl.
*H03H 9/15* (2006.01)
*H03H 9/54* (2006.01)

(52) U.S. Cl. ....................... 333/189; 310/328
(58) Field of Classification Search ............... 333/189
See application file for complete search history.

(56) References Cited

U.S. PATENT DOCUMENTS 6,720,844 B1 * 4/2004 Lakin .......................... 333/189
6,917,261 B1 * 7/2005 Unterberger ................. 333/189
6,927,651 B1 * 8/2005 Larson et al. ................ 333/189
6,963,257 B1 * 11/2005 Ella et al. .................... 333/133

OTHER PUBLICATIONS

K.M. Lakin; "Bulk Acoustic Wave Coupled Resonator Filters"; 2002 IEEE Frequency Control Symposium and PDA Exhibition; May 29-31, 2002, pp. 8-14.*
G.G. Fattinger et al.; "Coupled Bulk Acoustic Wave Resonator Filters: Key Technology for Single-to-Balanced RF Filters" ;2004 IEEE Microwave Symposium Digest MTT-S International; Jun. 6-11, 2004, vol. 2, pp. 927-929.*

* cited by examiner

*Primary Examiner*—Barbara Summons
(74) *Attorney, Agent, or Firm*—Roth & Goldman

(57) ABSTRACT

A single port multi-resonator acoustic resonator device (200, 300, 400, 490) possesses an input impedance that exhibits precisely designed electrical resonances. The device contains at least three parts: a transducer/resonator (201, 301, 401. 491) used both to interface to an external electrical circuit and to transform electrical energy into mechanical (i.e. acoustic) vibrations (and vice versa), and also function as a resonator; a mechanical (i.e. acoustic) resonator (203, 303, 460, 480) and an acoustic coupler (202, 302, 404, 494) that controls the acoustic interaction between the transducer/resonator and the mechanical resonator.

18 Claims, 20 Drawing Sheets

PRIOR ART FIG. 3

| Layer Sequence | Fig. 17 Ref. | Material | Thickness, um | Notes |
|---|---|---|---|---|
| Tuning Layer | 481 | SiO2 | 0.0200 | (e) |
| Mechanical Resonator | 480 | AlN | 2.3300 | |
| | | | | |
| Coupler layer 5 | 476 | SiO2 | 0.6350 | |
| Coupler layer 4a | 475 | SiO2 | 0.0750 | (b) |
| Coupler layer 4b | 474 | W | 0.2000 | (b) |
| Coupler layer 4c | 473 | SiO2 | 0.0750 | (b) |
| Coupler layer 3 | 472 | SiO2 | 0.6350 | |
| Coupler layer 2 | 471 | AlN | 1.1800 | |
| Coupler layer 1 | 470 | SiO2 | 0.6350 | |
| | | | | |
| Metal layer 3 | 467 | Al | 0.2200 | |
| Cap layer | 465 | Si3N4 | 0.0100 | (d) |
| Shift Layer | 466 | SiO2 | 0.0660 | (c) |
| Piezo | 460 | AlN | 1.9530 | |
| Metal layer 1 | 461 | Al | 0.2200 | |
| | | | | |
| Ref. Layer 9 | 459 | SiO2 | 0.6350 | (a) |
| Ref. Layer 8 | 458 | AlN | 1.1800 | (a) |
| Ref. Layer 7 | 457 | SiO2 | 0.6350 | (a) |
| Ref. Layer 6 | 456 | AlN | 1.1800 | (a) |
| Ref. Layer 5 | 455 | SiO2 | 0.6350 | (a) |
| Ref. Layer 4 | 454 | AlN | 1.1800 | (a) |
| Ref. Layer 3 | 453 | SiO2 | 0.6350 | (a) |
| Ref. Layer 2 | 452 | AlN | 1.1800 | (a) |
| Ref. Layer 1 | 451 | SiO2 | 0.6350 | (a) |
| | | | | |
| Substrate | 450 | Silicon | | |

(a) 9 total layers of nominal quarter wavelength thickness
(b) These three layers synthesize an effective impedance between that of W and SiO2. The thickness ratios are adjusted during the design process.
(c) The shift layer is used only on the shunt resonators in the ladder filter.
(d) The cap layer protects underlying layers from metal etch.
(e) Trim layer can be ion-milled to shift resonator frequency.

Fig. 16

SINGLE-PORT MULTI-RESONATOR ACOUSTIC RESONATOR DEVICE

FIELD OF THE INVENTION

This invention relates to acoustic devices and, more particularly, to acoustic bulk-wave piezoelectric resonator devices capable of exhibiting complex resonance properties and to frequency filters formed with those resonators. The resonator devices are useful over a wide range of frequencies and are particularly useful for operation at microwave frequencies.

BACKGROUND

Communications systems have need for components, such as resonators and filters, that control frequency generation or that limit the range of frequencies used in the systems. Resonators are not only formed of electrical inductor and capacitor circuits, but can also be electromechanical in nature, such as quartz crystals, surface acoustic wave devices, or thin film bulk acoustic resonators. Frequency filters also may be based upon that core resonator technology. Resonators exhibiting multiple resonances at nearby frequencies within a single structure would be particularly useful in frequency filters to produce multiple pass-bands and/or stop-bands of frequency. Both the resonators and the filters formed with those resonators may take advantage of the piezoelectric type of resonator, a form of electromechanical resonator.

In the simplest form, a piezoelectric electromechanical resonator is composed of a piezoelectric plate sandwiched between a pair of electrodes formed in a unitary assembly. Resonator 1, illustrated in FIG. 1a, representative of prior art to which reference is made, is composed of a piezoelectric plate 2 that possesses sufficiently aligned and smooth surfaces 3 and 4 to which metal plates or electrodes 5 and 6 are respectively attached. An electromechanical thickness-mode resonance is established by the piezoelectric transduction process, wherein electrodes 5 and 6 are electrically driven by a signal of such frequency that an acoustical standing wave is established across the thickness dimension of the piezoelectric plate, perpendicular to the plane of the electrodes. The acoustic deformation produced in the foregoing transduction propagates in a direction that is substantially normal to the piezoelectric plate and the electrodes, and is referred to herein as a bulk acoustic wave or simply a bulk wave. The bulk wave may be an acoustic shear wave which exhibits mechanical deformation in directions that are substantially transverse to the direction of propagation or an acoustic longitudinal wave that exhibits mechanical deformations in a direction that is substantially parallel to the direction of propagation.

The fundamental (e.g. the lowest frequency) resonance of the plate occurs when a half wavelength of standing acoustic wave is produced between the outer surfaces 7 and 8 of respective electrodes 5 and 6. Other higher-mode resonances occur at those higher frequencies at which an integral number of half-wavelengths of acoustic vibration exists between surfaces 7 and 8. Resonators having perfect physical symmetry, as suggested in FIG. 1a, exhibit only resonances at odd multiples of the fundamental frequency because of the coincidence of the odd symmetry of the applied voltage ("+" on one electrode, "−" on the other electrode) and the structural symmetry of the device. If the resonator is not structurally symmetric, then resonances may also occur at even order multiples of the fundamental frequency. In either case, the resonances are separated in frequency by a relatively wide margin, a margin that is approximately equal to the fundamental resonant frequency of the device.

In literature describing the prior art, the word resonator is sometimes used in two different senses creating a possible ambiguity. The first is to refer to that portion of the device that exhibits substantial mechanical vibratory deformations (i.e. acoustic vibrations) when periodically perturbed with a mechanical (acoustical) force at rates or frequencies near the mechanical resonant frequency of that portion of the device. Second, that literature also sometimes uses the word resonator to refer to the entire device. To avoid such an ambiguity, in this specification, unless the context indicates otherwise, the term "mechanical resonator" is intended to refer to a portion of the entire device that exhibits substantial acoustic vibrations. The term "resonator device" will refer to the entire device that contains that mechanical resonator together with a transducer, and that transducer may also function in the device as a second resonator. Further, with regard to the present invention, the term "resonator device or the term "dual-frequency resonator device" means the entire device, unless the context indicates otherwise.

Some additional definitions should be helpful to more quickly achieve an understanding of the invention. The term "transducer/resonator" usually means that portion of the acoustic resonator device that exhibits substantial acoustic vibrations near resonance and in which the transducer physically constitutes all or a substantial part of the transducer/resonator. The transducer is piezoelectric in character and includes electrically conductive electrodes or terminals for applying electrical voltages to (or extracting electrical voltages from) the piezoelectric material. The term "mechanical resonator", as earlier described, usually refers to a portion of a resonator device that exhibits substantial acoustic vibrations when perturbed at a frequency near the frequency of resonance of that portion of the device. The mechanical resonator does not include a transducer and is physically separate from the transducer/resonator, even though the mechanical resonator may be acoustically coupled to that transducer/resonator.

For clarity of illustration, the figures greatly exaggerate the thickness of the layers relative to the lateral extent of the layers. For example, in the bulk-wave piezoelectric resonator device of the type depicted in FIG. 1a, the lateral dimension of the electrodes, typically, will be of the order of fifty or so times greater than the thickness of the layer of piezoelectric material. Although not depicted in FIG. 1a, the piezoelectric layer also may extend laterally substantially beyond the right and left-hand boundaries of the electrodes. These extensions of the piezoelectric layer may be used to mechanically support the resonator device.

An acoustic device can include two or more portions that form resonators. Each of these portions exhibits an acoustic resonance. If one resonator portion is acoustically coupled to a second resonator portion, the two resonator portions interact. The interaction is similar to the effect that occurs with electrical coupling between two resonant electrical circuits (e.g. two circuits each circuit consisting of a series connection of an inductance and a capacitance) that are, individually, resonant at the same frequency. In such coupled electrical circuits, when one compares the magnitude of an electrical signal input to one resonant circuit to the electrical signal output from the second resonant circuit, as a function of frequency, one observes a narrow peak in the output signal near the resonant frequency of the two circuits when the electrical coupling between these two circuits is small, which level of coupling is commonly referred to as "under-coupled." As the electrical coupling is increased, the peak in the output signal increases in level and broadens out as a function of frequency. As the coupling is further increased the peak in the output signal versus frequency eventually broadens and splits into two separate peaks, peaked at different frequencies, with a dip in signal level between the two peaks. This circumstance is commonly referred to as "over-coupled." At the level of coupling where the peak is the broadest but does not yet exhibit a central dip, the circuits are said to be "critically-coupled." Acoustically coupled resonators exhibit similar effects.

Resonators of the conventional form (of FIG. 1a) are also known to exhibit additional resonances due to standing waves distributed parallel to the principal plate (e.g. electrode) surfaces 7 and 8. These resonances are formed by plate wave reflections at the edge of the electrodes or mounting structures. Such resonances are generally unwanted or spurious and are not used, except in some specialized applications. These resonances are normally avoided by using electrodes whose lateral dimensions are many times greater than the thickness of the piezoelectric layer. In a structure similar to that depicted in FIG. 1a, but in which the lateral extent of the electrodes is of the order of the plate thickness, the acoustic resonances are two dimensional in nature. Due to the construction of such a plate wave resonator, the lateral extent of the acoustic vibrations are substantially confined, or "trapped", by the width of the electrodes or some other physical feature. However, if two such resonators are placed in close lateral proximity, a small portion of the acoustic vibrations in the first resonator are acoustically coupled to the second resonator and induce some acoustical vibrations in the second resonator. In that configuration the lateral spacing of the two resonators controls the amount of acoustic coupling.

So-called monolithic, two-port, crystal filters have been fabricated from two or more "trapped energy" resonators placed in close lateral proximity. Wave coupling lateral to the plate thickness direction produces a split in the resonance and thus a multi-pole filter response when one resonator is driven and the other resonator is loaded into a circuit. The resonators are placed side-by-side and the coupling is perpendicular to the primary thickness resonance direction. The degree of resonator coupling and number of resonators affects the overall response.

In contrast to the side-by-side configuration of resonators in the filter described in the preceding paragraph, the present invention utilizes a transducer/resonator and a mechanical resonator that are vertically stacked, instead of being placed side by side, and, in the present invention, the transducer/resonator is separated from the mechanical resonator by layers of material that function as an acoustic coupler. The layers of the acoustic coupler are selected so as to obtain a desired degree of acoustic coupling between the transducer/resonator and the mechanical resonator. Additionally, the present invention is a single-port device.

In this specification the term "transducer" is intended to refer to a device (or that portion of a device) that converts electrical signals into mechanical vibrations (and vice-versa). The term "transduction" refers to the physical process of converting or transforming electrical signals into mechanical vibrations (and vice-versa). Thus, in the prior art transducer of FIG. 1a, the transducer is composed of electrodes 5 and 6 and piezoelectric material 2, and the resonator is bounded by surfaces 7 and 8 that reflect acoustic waves generated by the transduction process. That confines most of the acoustic vibrations to the region bounded by surfaces 7 and 8. In this simple case, the transducer constitutes the entire resonator portion of the device and is referred to herein as the transducer/resonator.

Reference is made to FIG. 1b, labeled "prior art". FIG. 1b illustrates an acoustic resonator device that constitutes a variation of the simple, thickness-mode plate resonator of FIG. 1a. Here, transducer 51 is attached to layer 59 in a vertically stacked unitary assembly so that the combination forms a resonator device 50. At resonance, a half wavelength (or appropriate multiple of a half wavelength) acoustic wave is produced between surfaces 57 and 60. Although transducer 51 may, alone, be substantially less than a one-half (acoustic) wavelength in thickness, the distance between surface 57, the upper surface of the transducer, and surface 60, the bottom surface of layer 59 comprises one-half acoustic wave-length or a multiple thereof. The principal acoustic vibrations occur between surfaces 57 and 60. The combination of transducer and layer 59, which together have an acoustic thickness of one-half acoustic wavelength, is also referred to herein as a "transducer/resonator." It should be remembered, however, that in many instances the transducer may constitute all of the resonator.

As a further variation of the foregoing configuration, transducer 51, alone, may be a half wavelength thick, and layer 59 is then a half wavelength thick or an integral multiple thereof. In this latter case these resonator devices are conventionally referred to as "overmoded" resonators, see K. M. Lakin, G. R. Kline and K. T. McCarron, "High Q Microwave Acoustic Resonators and Filters", IEEE Trans. Microwave Theory Tech. Vol. 41 no. 12, December 1993, pp. 2139–2146.

A further variation on the thickness mode plate resonator device is shown in FIG. 2. Here a single port, resonator device 90 comprises substrate 80, acoustic isolator 89, and transducer/resonator 79 in a vertically stacked integral (e.g. unitary) assembly. Substrate 80 is the general support structure and may consist of any of a wide variety of materials, such as silicon, alumina, sapphire, or other material, generally in a wafer form that is compatible with integrated circuit processing techniques. Acoustic isolator 89 may consist of a single layer of material or of a sequence of quarter wavelength thick layers of material, illustrated in this example as layers 81 through 85, in sufficient numbers and having sufficient relative impedance discontinuities between adjacent layers, to thereby acoustically isolate transducer 79 from substrate 80. Such layers are often designed to have alternating extremes of acoustic impedance such that significant wave reflections occur at surfaces 91 through 96 such that little or no vibrations reach substrate 80. Typically layers of high impedance materials such as aluminum nitride ("AlN") or tungsten ("W") alternate with layers of low impedance materials such as silicon dioxide ("SiO$_2$"). An acoustic isolator is sometimes referred to herein as a reflector.

Transducer 79 is composed of piezoelectric region 87 and interfaces 97 and 98, to which are attached associated electrodes 86 and 88. Electrodes 86 and 88 include external points of electrical connection to other circuitry, not illustrated. Transducer 79 also serves as a resonator. The acoustic vibrations at resonance are substantially confined between surface 96, i.e. the inner or lower boundary of the transducer, and the air or vacuum interface at surface 99, i.e. the outer or upper surface of the transducer, in a manner similar to that of the conventional resonator illustrated in FIG. 1a.

The acoustic vibrations in device 80 rapidly diminish with distance from resonator 86 within the isolator reflector array 81 through 85, as illustrated in FIG. 3, to which reference is made. In FIG. 3 transducer region 79, which is about 4.00 μm thick at 1600 mhz, shows a half wavelength of acoustic vibration. The standing wave rapidly diminishes in amplitude throughout acoustic isolator 89 with little wave amplitude reaching substrate 80. For this example, electrodes 86 and 88 are each 0.3 μmeters of aluminum, piezoelectric material 87 is 3.0 μmeters of AlN, with the reflector sequence starting with 0.7 μm of $SiO_2$ and then 1.76 μmeters of AlN alternating until the final layer of $SiO_2$ is reached. The wave distribution was calculated for 1600 MHz with +1.0 Volt on electrode 88 and −1.0 Volt on electrode 86.

In contrast to the resonator devices of FIGS. 1a and 1b, the graph of the amplitude of acoustic vibration vs distance presented in FIG. 3 illustrates that the acoustic vibrations in resonator device 90 of FIG. 2 extend beyond the boundaries of transducer/resonator 79 and, in fact, penetrate into isolator 89. Because the acoustic vibrations are not entirely confined to transducer/resonator 79, and because a small portion of these vibrations extend into the isolator, the electrical and acoustic properties of the device are, to some extent, affected by the presence of and the acoustical properties of the layers of material that constitute the isolator. Resonators of the type described in FIG. 2 have been disclosed in U.S. Pat. Nos. 3,414,832 and 5,373,268 and 5,821,833.

Because the present invention possesses more complex properties, to aid in understanding the present disclosure, electrical resonances are defined in terms of the electrical impedance of the structure rather than by the more conventional half-wavelength or frequency-thickness descriptions. The electrical characteristics of a piezoelectric resonator can be described by the electrical impedance of the input port, i.e. at the input terminals to the electrodes, and in a manner analogous to well known inductor-capacitor resonant circuits. Most useful in identifying and defining the meaning of electrical resonance in such a one-port device is the nature of the phase of the electrical input impedance, $Z_{in}$, as a function of frequency, f. As an example, reference is made to FIG. 4 showing the computed phase and magnitude of the electrical input impedance of a resonator near the fundamental resonant frequency of approximately 1600 MHz. The magnitude of the input impedance is shown as a dashed line and the phase of the input impedance is shown as a solid line. At frequencies 120 below electrical resonance, the phase is near −90 degrees (lagging), which is analogous to a capacitive reactance. At frequency 121, the phase slope is positive, the phase is zero degrees, and the impedance is purely resistive and at a minimum value. The conditions of positive phase slope, zero phase, and minimum impedance characterize series resonance.

Between frequencies 121 and 123, the phase 124 is positive, analogous to an inductance. At frequency 123 the phase slope is negative, the phase is zero, and the impedance is resistive and of high value relative to the resistive impedance at 121. The impedance conditions at 123 characterize parallel resonance. At higher frequencies 125, the phase is again negative, analogous to a capacitive reactance. For the purpose of this specification, series resonance means the frequency at which the input impedance exhibits zero phase and a positive phase slope with a relatively low value of resistive impedance. In contrast, parallel resonance means a frequency at which the input impedance exhibits zero phase, negative phase slope and a relatively high resistive impedance.

A simple resonator of the prior art whose input impedance exhibits an input phase that undergoes a phase excursion from approximately −90 degrees to approximately +90 degrees and then back to approximately −90 degrees as the frequency increases, such as that depicted in FIG. 4, is referred to in this specification as a single-frequency electrical resonator. The single frequency resonator exhibits an electrical resonance that includes both a series resonance and a parallel resonance at a slightly higher frequency. For the purpose of this specification, the frequency increment between series resonance, 121, and parallel resonance 123 is defined as the resonator bandwidth. The mean of the series resonance frequency and the parallel resonance frequency is referred to as the nominal resonant frequency. Although the prior art device depicted in FIG. 1a is referred to as a single-frequency electrical resonator, the device exhibits similar phase excursions at each a series of the harmonic electrical resonance's. Those harmonic electrical resonances occur at approximately odd integer multiples of the frequency of the fundamental electrical resonance for the simple resonator.

A purely mechanical resonator possesses resonances that are defined by peaks in acoustic standing wave amplitude. The concept of electrical series or parallel resonance is inapplicable to mechanical resonators. The frequency at which a mechanical resonator, in the absence of acoustic coupling to other portions of the device, would exhibit a peak in the amplitude of the acoustic standing wave is referred to herein as the mechanical resonant frequency of the isolated mechanical resonator.

Methods for fabrication of piezoelectric resonators for use at microwave frequencies are well known in the prior art. See, e.g., the descriptions of such devices in the specification of U.S. Pat. No. 5,894,647 for a "Method for Fabricating Piezoelectric Resonators and Product", Lakin, and see the references to prior art cited therein. See also "Microwave Acoustic Resonators and Filters," by Lakin, Kline and McCarron, IEEE Trans. on Microwave Theory and Techniques, Vol. 41, No. 12, December 1993, p. 2139; Guttwein, Ballato and Lubaszek, U.S. Pat. No. 3,694,677; and "Acoustic Bulk Wave Composite Resonators", Applied Physics Letters 38(3) by Lakin and Wang, Feb. 1, 1981. Such resonators also may be fabricated on, and supported by, a substrate by including a set of intervening layers of material having alternating high and low acoustic impedances, which layers have thickness' of a quarter wavelength. The intervening layers act as an acoustic mirror or reflector that acoustically isolates the resonator from the underlying substrate. See, e.g., U.S. Pat. Nos. 3,414,832 and 5,373,268 and 5,821,833 and 6,291,931. For methods of analysis and further descriptions of reflectors and resonators see Lakin, "Solidly Mounted Resonators and Filters, 1995 IEEE Proc. Ultrasonics Symposium, pp. 905–908 and Lakin et al. "Development of Miniature Filters for Wireless Applications", IEEE Trans. on Microwave Theory and Techniques, Vol. 43, No. 12, December 1996, pp. 2933–2939. It is expressly understood that the content of the foregoing prior art publications, as well as the content of any other prior art cited herein by reference to a publication or a patent is incorporated herein by reference in the entirety.

The present invention relates to single-port microwave acoustic resonator devices and, more particularly, to obtaining electrical resonances at the input impedance of the single-port electro-acoustic resonator device that have a more diverse range of properties or that are more complex than the properties exhibited by a simple, single resonator device. That result is obtained using techniques of controlling the resonant frequencies of the transducer/resonator and of the mechanical resonator and by controlling the amount of acoustic coupling between the transducer/resonator and the mechanical resonator.

Accordingly, a principal object of the invention is to provide a single port, piezoelectric resonator device, useful at microwave frequencies, whose input impedance exhibits a more complex and diverse character than can be obtained from a prior art one-port device comprising a simple transducer/resonator.

A further object of the invention is to design a single port, piezoelectric resonator device, useful at microwave frequencies, whose input impedance exhibits two or more electrical resonances that are not harmonically related and are located relatively close together in frequency.

A further object of the invention to provide in a one-port microwave acoustic resonator device whose input impedance exhibits at least two frequencies of electrical resonance that are spaced apart in the frequency spectrum by a fractional increment of the first resonance.

SUMMARY OF THE INVENTION

A single port, multi-resonator acoustic resonator device of the invention possesses an input impedance that exhibits one or more precisely designed electrical resonances within a frequency band, the width of which frequency band is less than one-half of the center frequency of said frequency band. The resonances result from propagation of bulk wave longitudinal or shear waves in the thickness dimension of the resonator device. More specifically, one or more electrical resonances are obtained by acoustically coupling a transducer/resonator and a mechanical resonator in a vertically stacked relationship in a single-piece integrated assembly with acoustic coupling layers stacked lamination-like in-between.

In accordance with the invention, a single-port, multi-resonator acoustic resonator device contains three principal parts: a transducer/resonator used both to interface to an external electrical circuit and to transform electrical energy into mechanical (i.e. acoustic) vibrations (and vice versa), and also function as an acoustic resonator; a mechanical (i.e. acoustic) resonator and an acoustic coupler that controls the acoustic interaction between the transducer/resonator and the mechanical resonator.

The transducer may comprise all, or only a portion of, the transducer/resonator. The transducer/resonator interfaces with the external electrical circuit, generates acoustic waves that propagate through the acoustic coupler to the mechanical resonator, and otherwise provides normal acoustic resonance "behavior." The mechanical resonator provides a second resonant structure within the resonator device that possesses resonant and physical properties separate from that of the transducer/resonator. The acoustic coupler controls the acoustic interaction between the transducer/resonator and mechanical resonator. It should be noted that in some instances herein, the transducer-resonator is sometimes referred to simply as the transducer. Nonetheless, even though referred to as a transducer, it should always be understood that the transducer also inherently constitutes a resonator.

The resonator devices constructed in accordance with my invention and described in this specification are single-port devices. That is, the resonator device contains an input port that contains a pair of electrical terminals to input an external electrical signal. The resonator device does not include a second (or output) port. Nonetheless, such a single or one-port device may be combined with other, similar, one-port devices into an electrical network, such as the ladder network depicted in FIG. 13b, to create a frequency filter that contains both input and output ports. Alternatively, the device may be integrated into an electronic chip assembly that forms a two port device. In short, the one-port device of the invention may be combined in a network with other one-port devices to create a two-port device, e.g. a two-port filter.

My companion U.S. Pat. No. 6,720,844 discloses a two-port filter that includes two transducer/resonators and that may also include a mechanical resonator. In the device shown in the '844 patent, an electrical signal is input into the input port of the device and a "filtered" signal is output from the output. The filtering properties of the '844 device allow only those frequencies located within the pass-band of the filter to be output at the output port of the two-port device. Because the '844 device is a two-port device, it necessarily includes two transducers, one to convert the electrical signal at the input port into an acoustical vibration within the device and a second transducer to convert the acoustic vibrations into an electrical signal at the output port of the device.

In contrast to a two-port device in which the signal is input into one port and a filtered signal exits from the second port, in a one-port device the signal that is input to the one port, in effect, exits in modified form from the same port. As a consequence, the one-port device operates and is used in a distinctively different manner than a two-port device.

The coupled-resonator filters described in my U.S. Pat. No. 6,720,844 are two-port devices, each device having an input port attached to an input transducer-resonator and an output port attached to an output transducer-resonator. Both the input and output transducer include a respective piezoelectric layer and a pair of electrodes with attached terminals. In contrast to prior-art, two-port filters, the resonator device of the present invention is a single or one-port device, containing only a single input transducer (or an equivalent single input port when formed as part of an integrated device). In the resonator device of the present invention, the input transducer may constitute all or a portion of one resonator within the device. As becomes clear from the following description and drawings, a second resonator used in the present invention does not constitute an output transducer and need not be formed of a material that is piezoelectric in character and does not require inclusion of electric terminals or electrodes in association therewith. Any solid vibration conducting material serves the purpose. The second resonator of the resonator device, however, could be formed of piezoelectric material, and could include layers of electrically conductive material (used for instance to provide particular acoustic properties) that may be bound to that piezoelectric layer. There is no purpose served by doing so other than to unnecessarily increase the complexity of the acoustic device. In the present invention, the mechanical resonator preferably does not include piezoelectric or conductive materials.

Although this specification describes examples of the invention that operates at microwave frequencies, it should be understood that devices embodying this invention are not limited to operation only at microwave frequencies, but may be designed to operate in any of a wide range of frequencies.

The foregoing and additional objects and advantages of the invention, together with the structure characteristic thereof, which were only briefly summarized in the foregoing passages, will become more apparent to those skilled in the art upon reading the detailed description of embodiments of the invention, which follow in this specification, taken together with the illustrations thereof presented in the accompanying drawings.

BRIEF DESCRIPTION OF THE DRAWINGS

In the drawings:

FIG. 1b pictorially illustrates, not-to-scale, a composite resonator device of the prior art that builds upon the structure of FIG. 1a;

FIG. 16 is a table listing layer thickness and materials for the example design.

DETAILED DESCRIPTION OF THE PREFERRED EMBODIMENTS

Figure 5:
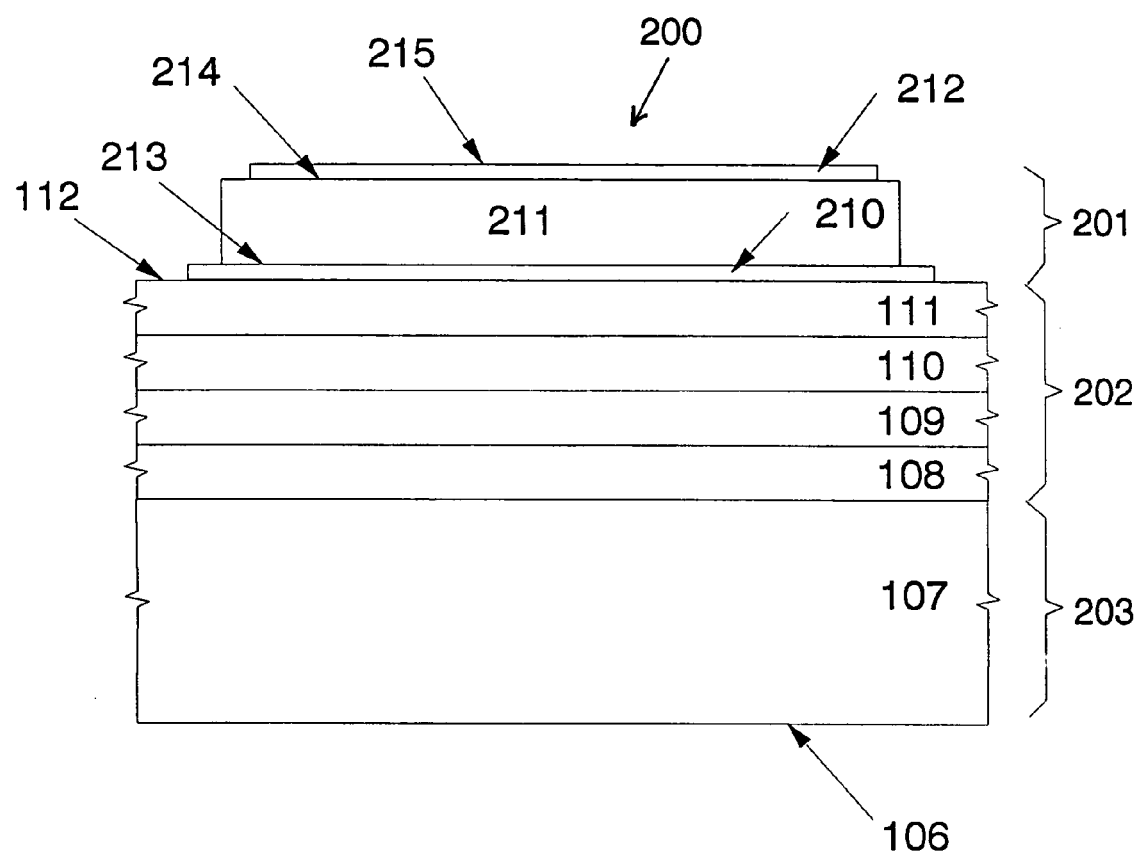
FIG. 5 pictorially shows, not-to-scale, a first embodiment of the multi-resonator acoustic resonator device of the invention.

A first embodiment of the present invention is illustrated in FIG. 5 as resonator device 200, composed of transducer/resonator 201, mechanical resonator 203, and acoustic coupler 202, all of which elements are integrated in a vertically stacked, unitary assembly. Transducer/resonator 201 is primarily composed of piezoelectric region 211 and the associated electrodes 210 and 212, respectively attached at interfaces 213, 214. The resonator portion of transducer-resonator 201 also necessarily includes a portion of the acoustic coupler 202 in effect as herein described. Transducer 201 is electrically driven by an electrical signal applied across electrodes 210 and 212. Transducer/resonator 201 need not be restricted in composition to the simple three layer structure of electrode, piezoelectric layer and electrode, illustrated in FIG. 5, but may be composed of other more complex structures that exhibit a single acoustic resonance at its fundamental resonant frequency as described, for example, in U.S. Pat. Nos. 6,239,536, 6,291,931 and 5,894,647. Mechanical resonator 203 may be formed of a single solid material 107, capable of propagating vibrations, that is one or more half-wavelengths in thickness or alternatively is composed of a series of layers of different materials over which a single or a multiple of a half wavelength of phase shift occurs at acoustic resonance. Acoustic coupler 202 may be composed of a single material layer or a sequence of layers of solid sound conductive material, e.g. layer 108, 109, 110 and 111, so long as a desired degree of acoustical coupling exists between mechanical resonator 203 and transducer/resonator 201.

Maximum acoustical coupling occurs when transducer/resonator 201 is directly attached to resonator 203 without intermediate layers of material of acoustic coupler 202. However, as later herein discussed, direct attachment does not permit control of the amount of the acoustic coupling between the transducer/resonator and the mechanical resonator; and that control is desired. Acoustic coupler 202 may consist of a combination of one or more quarter-wavelength thick layers of material having different acoustic impedances. The acoustic transmission properties of the combination of layers may be greater or less than that available from a single layer of a single material. A detailed description of similar acoustic couplers is found in my related patent to Lakin, U.S. Pat. No. 6,720,844, "Coupled Resonator Bulk Acoustic Wave Filter" which is incorporated herein in it entirety by reference.

Figure 6:
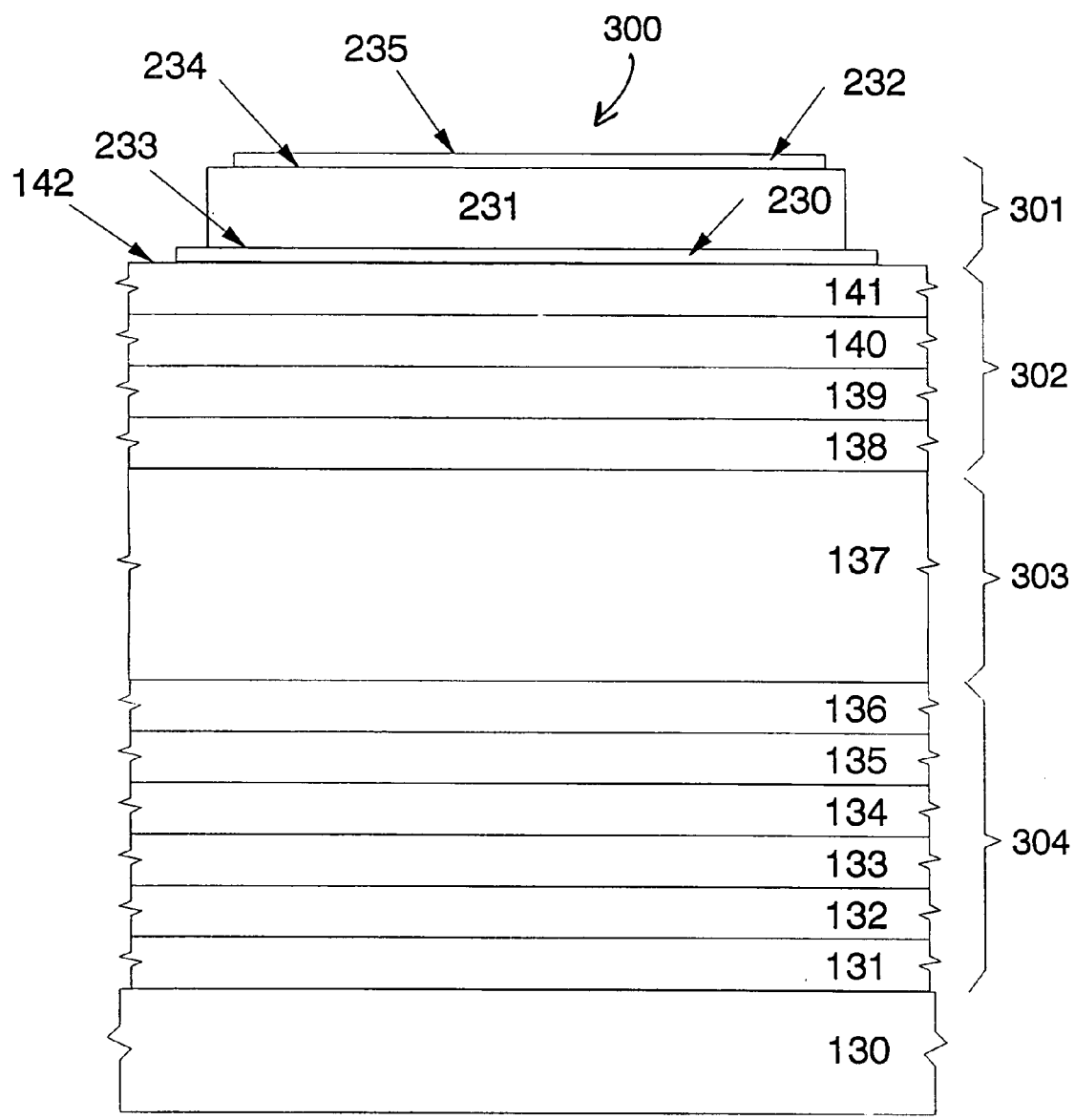
FIG. 6 pictorially shows, not-to-scale, a second embodiment of the multi-resonator acoustic resonator device of FIG. 5 mounted on and acoustically isolated from a substrate.

A second embodiment of the invention is illustrated in FIG. 6 as resonator device 300 to which reference is made. In this embodiment resonator device 300 is formed in an integral assembly with or attached to a substrate 130 through acoustic isolator 304. Resonator device 300 is composed of transducer/resonator 301, acoustic coupler 302, formed of layers 138, 139, 140 and 141, mechanical resonator 303, and isolator 304 formed as a vertical stack atop substrate 130 in an integral, one piece assembly. Isolator 304 is formed of multiple layers of solid sound conducting material, 131, 132, 134, 135, 136, and 138.

Figure 7:
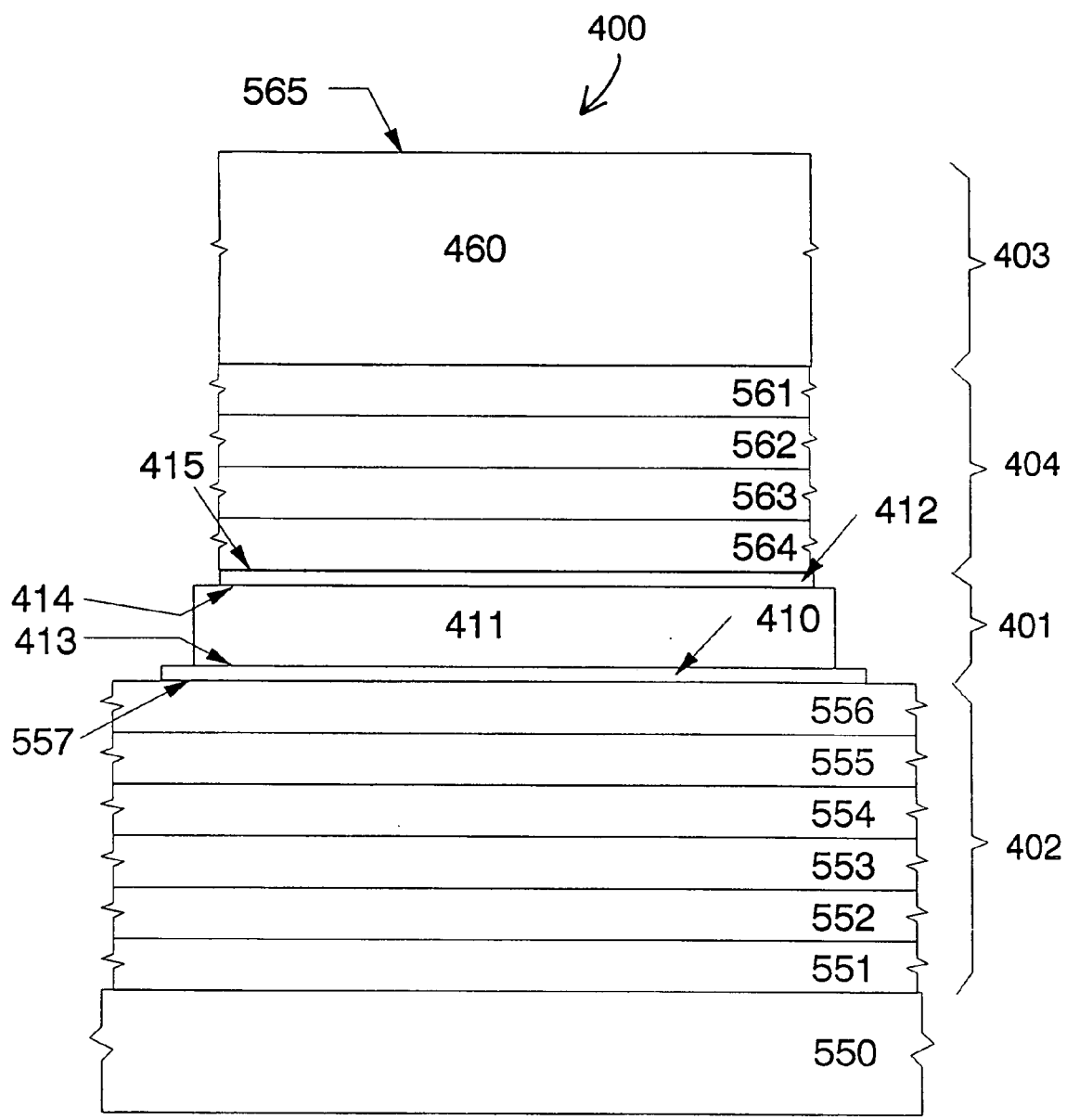
FIG. 7 pictorially shows, not-to-scale, a third embodiment of a multi-resonator acoustic resonator device of the invention that is mounted on, and acoustically isolated from, a substrate.

A third embodiment of the invention, resonator device 400, is illustrated in FIG. 7 to which reference is made. Resonator device 400 is composed of a vertically arranged stack of layers containing mechanical resonator 403, acoustic coupler 404, transducer/resonator 401, isolator 402, and substrate 550 formed in a stacked, one-piece integral assembly. In this configuration mechanical resonator 403, formed of a slab or block of solid vibration conducting medium, is situated as the top portion of resonator device 400 to have the top surface 565 accessible. Transducer/resonator 401 may be fabricated in different arrangements of varying complexity, but, at a minimum, includes a piezoelectric region 411 and electrodes 410 and 412 to which electrical signals may be applied to drive the resonator device. Acoustic isolator 402 may be composed of one or more layers of material, such as layers 551 through 556, that produces a sufficient acoustic isolation between transducer 401 and substrate 550 inhibiting or blocking propagation of vibratory energy there between. The structure of mechanical resonator 403 supports a standing wave of one or more half-wavelengths of acoustic vibrations extending between the upper and lower boundaries of mechanical resonator 403. Acoustic coupler 404 is composed of one or more layers of solid sound conducting material, such as layers 561 through 564, that provide a controlled amount of coupling of acoustic energy between transducer/resonator 401 and mechanical resonator 403.

In a acoustic resonator comprising one or more layers of material, the acoustic phase velocity within such a layer of material and the physical thickness of the layer of material may change with a change in temperature, both of which changes with temperature may alter the acoustic resonant frequency of the acoustic resonator. Mechanical resonators 203, 303, and 403 of FIGS. 5, 6, and 7, respectively, that are each shown as a single layer of material in each of the figures, may each, instead, consist of a combination of thin layers of different materials, the combination of layers together having a total acoustic thickness of one-half wave length or an integral multiple thereof at the center frequency of the desired frequency band. By combining layers of material such as silicon dioxide or quartz that have an acoustic phase velocity that exhibits a positive temperature coefficient with layers of material such as sapphire or aluminum nitride, which have an acoustic phase velocity that exhibits a negative temperature coefficient, one may obtain a combination of layers with the desired response to changes in temperature or to provide temperature compensation.

The advantage of the configurations of mechanical resonators 203 and 403, respectfully pictorially depicted in FIGS. 5 and 7, is that one surface of each of the respective mechanical resonators is readily accessible for frequency trimming operations. During manufacture of a resonator device, one may find that mechanical resonator 203 (or 403) may require an adjustment in resonant frequency. That adjustment can be accomplished by altering the thickness of the layer forming the respective mechanical resonator 203 (or 403). Thickness adjustments of the mechanical resonator can be made during fabrication of the device by either depositing a thin additional layer of material upon the surface of the mechanical resonator so as to lower the resonant frequency or by removing a thin layer of the material by means of various known etching techniques so as to increase the resonant frequency. Such deposition and etching techniques are well known in the art of semiconductor and microelectronics processing and need not be described herein in detail.

The free surfaces of elements 203 and 403, namely, surfaces 106 and 565, respectively, may include a thin layer of material, such as aluminum or silicon dioxide, that is amenable to thinning by chemical etching or by ion bombardment (i.e. ion milling). For example, if layer 107 is formed of sapphire, a material that is difficult to selectively thin by chemical etching or by ion milling, then a thin layer of metal or insulator, such as silicon dioxide, that would allow the etch process to occur more easily could be added onto the sapphire layer. In general, since etch operations are easier to control than depositions, mechanical resonators 203 and 403 of the respective resonator devices would typically be fabricated to include outer layers of material that can easily be etched to obtain the final resonant frequency desired. The layer, referred to herein as a trimmer layer, can be etched, bit by bit, to raise the resonant frequency in minute increments until the desired resonant frequency is obtained. Alternatively, material could be added in small increments to the mechanical resonator by various deposition processes to lower the resonant frequency of the mechanical resonator.

When the acoustic vibrations of two resonators are acoustically coupled by some mechanism, the acoustic properties of the coupled structures are not simply the arithmetic sum of the properties of the individual resonators. In a fashion similar to that earlier described, depending upon the amount of acoustic coupling between the two resonators, the combination may exhibit an input impedance having a single electrical resonance, or two electrical resonances separated by a relatively small amount of frequency. The degree of frequency separation between the two resonances is controlled by the amount of the acoustic coupling, irrespective of whether that coupling is electrical or mechanical.

In the present invention the amount of acoustic coupling between transducer/resonators 201, 301, and 401 and corresponding mechanical resonators 203, 303, and 403, in the respective embodiments of FIGS. 5, 6 and 7 is determined by the transmission coefficient of acoustic couplers 202, 302, and 404, respectively. The transmission coefficient of each acoustic coupler is further modified by the degree of impedance mismatch between the transducer as a source and the mechanical resonator as a load. If the acoustic coupling is small then the mechanical resonator is more isolated and the acoustic resonance thereof is of higher Q. With a small amount of acoustic coupling the input impedance will be a combination of a broad electrical resonance from the transducer typically exhibited by a conventional piezoelectric resonator, with the superposition of a narrow electrical resonance that's due to the mechanical resonator.

Figure 8:
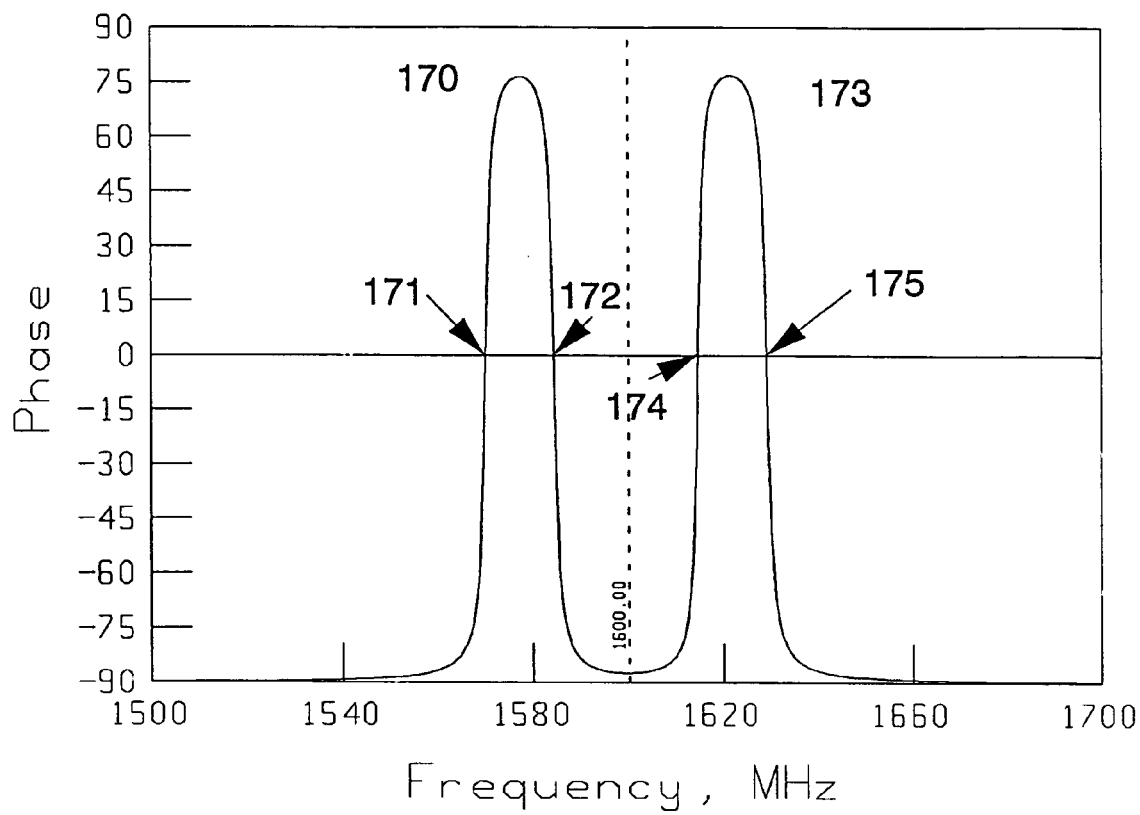
FIG. 8 is a chart of the calculated phase of the input impedance of the resonator device embodiment of FIG. 6 versus frequency, showing multiple electrical resonances.

FIG. 8 presents an example of the phase of the electrical input impedance, $Z_{in}$, versus frequency that can occur when the mechanical resonator 303 (of FIG. 6) is formed of a single half-wavelength thick layer. As is depicted in FIG. 8, the phase of the input impedance undergoes two phase excursions, one excursion centered near 1580 MHz and a second excursion centered near 1620 MHz. The series resonant frequencies occur at 171 and 174 and the parallel resonances occur at 172 and 175, respectively. The device thus exhibits what appear to be two independent resonances that are located near to each other in frequency. The approximate difference in frequency between these two phase excursions, in this instance approximately 40 MHz, is referred to in this specification as the frequency split in the dual-resonator acoustic resonator device of FIG. 6. In each of the phase excursions, the difference between the series resonance frequency and the parallel resonance frequency for that phase excursion is referred to as the bandwidth. Thus while resonator device 300 is a single port device having one electrode pair for electrical contacts, the input impedance at that port exhibits two electrical "resonance-like" responses and each such electrical resonance-like response includes a series resonance and a parallel resonance. Such a device is referred to herein as a dual resonance device or as a dual-frequency device.

Figure 9:
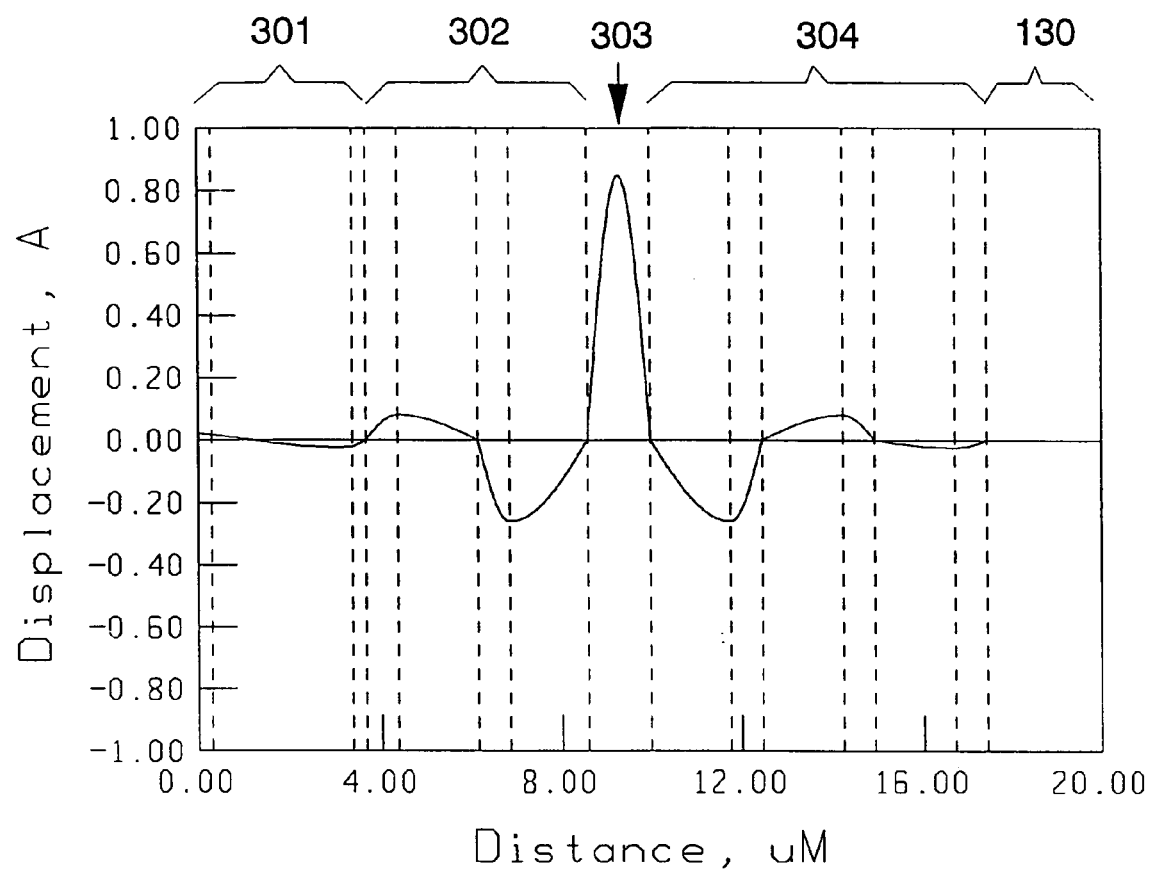
FIG. 9. is a chart showing the calculated amplitude of the acoustic vibrations versus distance within an embodiment of the multi-resonator acoustic resonator device of FIG. 6.

FIG. 9 shows the amplitude of the acoustic vibrations in a particular example of the structure of resonator device 300 (of FIG. 6) as a function of the depth into the vertical structure for the resonant frequency of 1600 MHz. The depth of the various elements, transducer 301, coupler 302, isolator 304 and substrate 130 are represented along the top side of the chart. The amplitude of the acoustic vibrations in mechanical resonator 303 is much larger than the amplitude of the acoustic vibrations in transducer/resonator 301 because the mechanical resonator is only loosely coupled to the transducer/resonator and suggests a higher quality factor ("Q").

Figure 10:
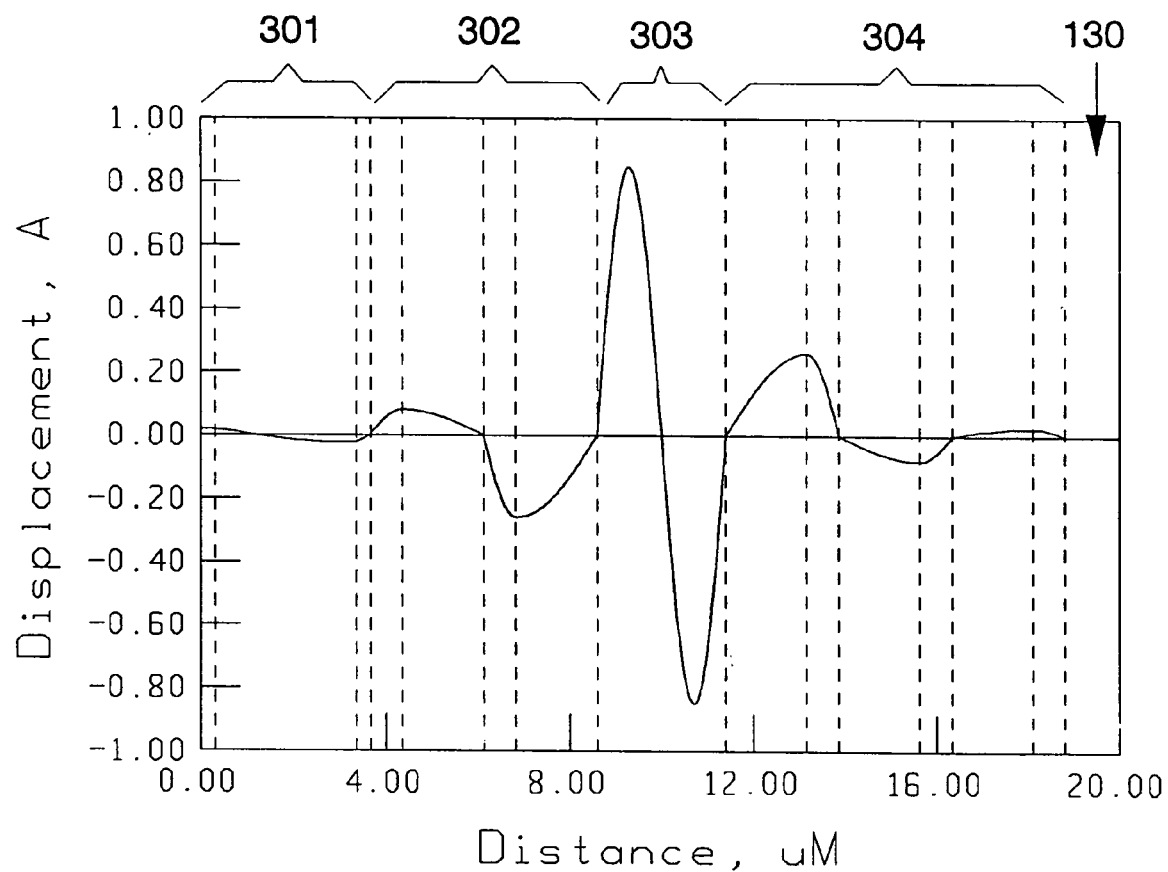
FIG. 10 is a chart showing the calculated amplitude of the acoustic vibrations versus distance in an alternate embodiment of the multi-resonator acoustic resonator device of FIG. 6 in which the resonator layer in that device is one wavelength thick.
Figure 11:
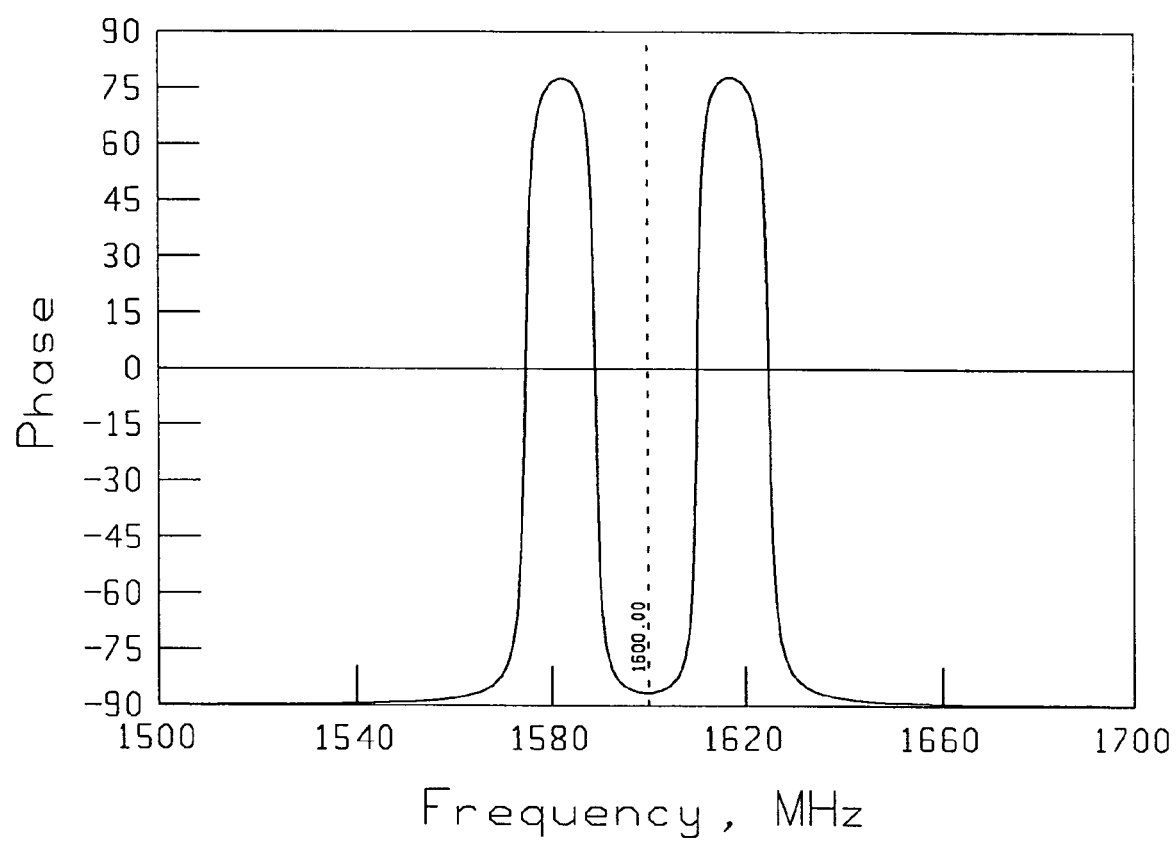
FIG. 11 is a chart of the calculated phase of the input impedance of the alternate resonator device invention of FIG. 6 versus frequency in which the mechanical resonator is one wavelength thick showing the dual resonance characteristic and smaller separation in frequency between the resonance peaks than in FIG. 8.

The amount of frequency splitting can be altered by narrowing the bandwidth of the nominal or isolated mechanical resonance of either transducer/resonator 301 or of mechanical resonator 303. For example in FIG. 10 mechanical resonator 303 is a full wavelength thick instead of one-half wavelength thick, thereby causing the wave phase across 303 to change more rapidly with change in frequency and produces a narrower mechanical resonance. As a consequence the resultant electrical resonance splitting, shown in FIG. 11, is more closely spaced than in FIG. 8.

Another way to alter the amount of frequency splitting is to adjust the amount of acoustic coupling between the transducer/resonator and the mechanical resonator. The amount of acoustic coupling can be altered by changing the level of impedance conversion and the transmission coefficient across the coupler. If the coupler is composed of a number of quarter wavelength layers, the level of impedance conversion can be controlled by the number of layers, the impedance of the layers relative to each other, and finally by the coupler input and output impedances relative to the source (transducer) and load (mechanical resonator) impedances. Odd numbers of quarter wavelength layer sequences provide the greatest degree of impedance conversion from one side of the acoustic coupler to the other. Using coupler layers having greater impedance ratios allows the use of fewer layers. Some specific examples will be given to illustrate the design process.

The methods of analysis referred to in the Background section of this specification can be used to model these devices and determine appropriate layer types and thicknesses. However, as a practical matter, one does not have a large latitude in the choice of materials and as a consequence, the values of the acoustic impedances that are available for use in the layers of the acoustic coupler is limited. If, in a preliminary design, a particular quarter-wavelength layer's impedance does not correspond to the acoustic impedance of an available material, one may still be able to achieve the desired properties for the acoustic coupler by using layers of available material and by slightly altering from a quarter wave the thickness of some of the layers of material in the acoustic coupler. Some layers will then be slightly thicker than one-quarter wave and some layers will be slightly thinner than one-quarter wave. In effect, each quarter wave-length layer then comprises a combination of materials, most from one layer and some from adjacent layers. Viewed another way, if the coupling that can be obtained using layers of available materials is smaller than desired, the amount of acoustic coupling can be increased by slightly "de-tuning" the coupler by changing the thickness of some of the layers so that they a depart slightly from a quarter wavelength.

The bandwidths of each of the two electrical resonances can be controlled by adjusting the amount of acoustic coupling between the transducer/resonator and the mechanical resonator and by adjusting the difference between the nominal acoustic resonant frequency of the transducer/resonator and the nominal or isolated acoustic resonant frequency of the mechanical resonator. For example, if the initial uncoupled transducer/resonator's nominal acoustic resonant frequency is the same as the nominal acoustic resonant frequency of the uncoupled mechanical resonator, then, when the resonators are acoustically coupled, the frequency split is symmetrical with two nearly identical electrical resonances being obtained, as shown in FIGS. 8 and 11. Shifting the nominal acoustic (or mechanical) resonant frequency of the transducer/resonator relative to the nominal acoustic resonant frequency of the mechanical resonator unbalances the split, and that split can be used to obtain two electrical resonances having different bandwidths.

In some applications it may be desirable to have a mechanical resonator that exhibits a temperature stable nominal resonant frequency. In this case the material in the mechanical resonator can be chosen to have the desired temperature coefficient.

Figure 12:
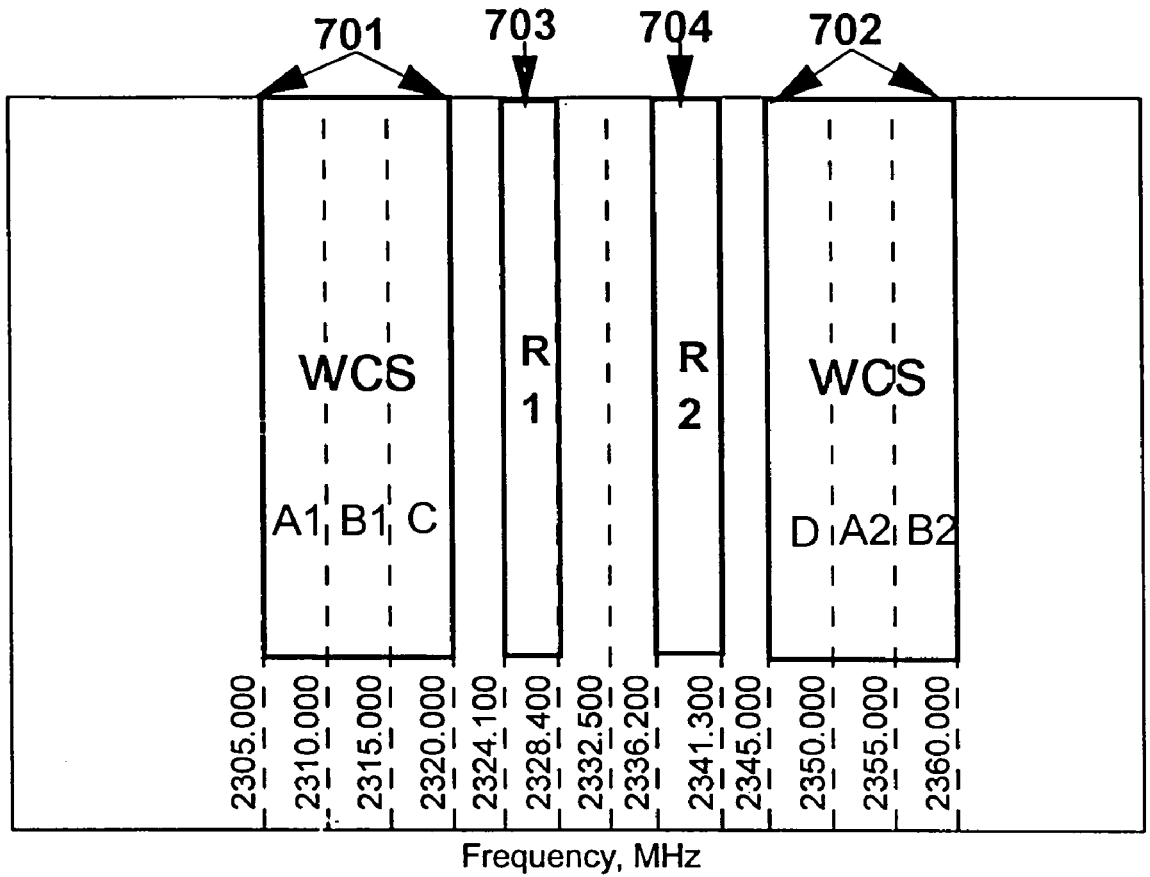
FIG. 12 is a chart of a desired frequency allocation used in connection with the design discussion of a ladder filter that incorporates resonator devices of the invention.

Consider a preferred procedure for a filter design. Say, as example, that a filter is desired that provides for a dual bandpass response with a high degree of signal rejection between the two passbands, e.g. a rejection of at least 20 dB. The problem is illustrated in FIG. 12 where bands 701 and 702 are desired passbands and bands 703 and 704 are to be rejected by 20 dB. Bands 701 and 702 therefore are to receive minimal attenuation in the design. The problem is severely complicated by the small frequency difference between the upper frequency boundary of band 701 and the lower frequency boundary of band 703 and similarly for the small frequency difference between band 704 and band 702. Accordingly, the filter skirt must be very steep, suggesting the filter needs high Q resonators.

Figure 1A:
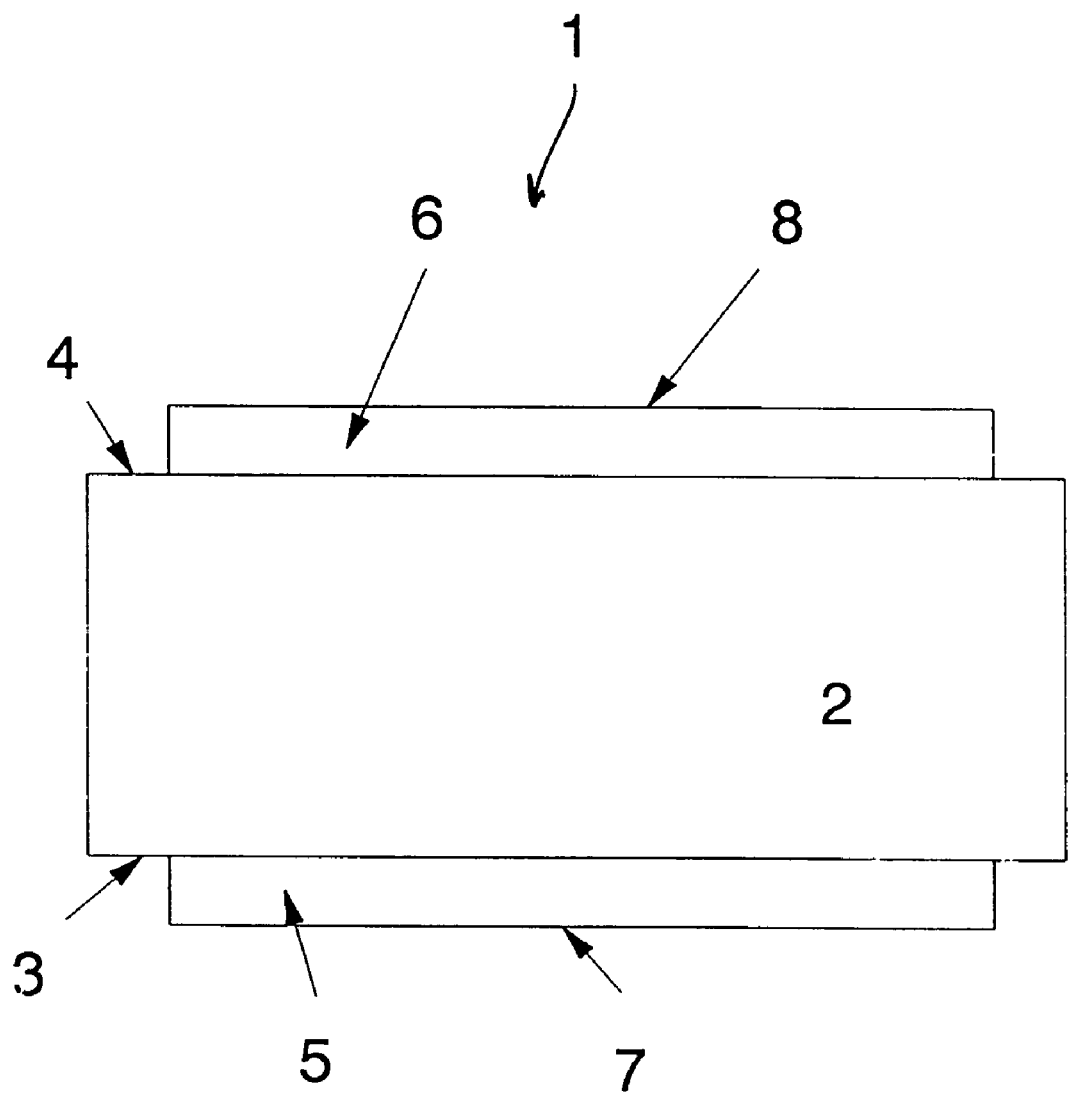
FIG. 1a pictorially illustrates, not-to-scale, a basic resonator device of conventional structure.
Figure 1B:
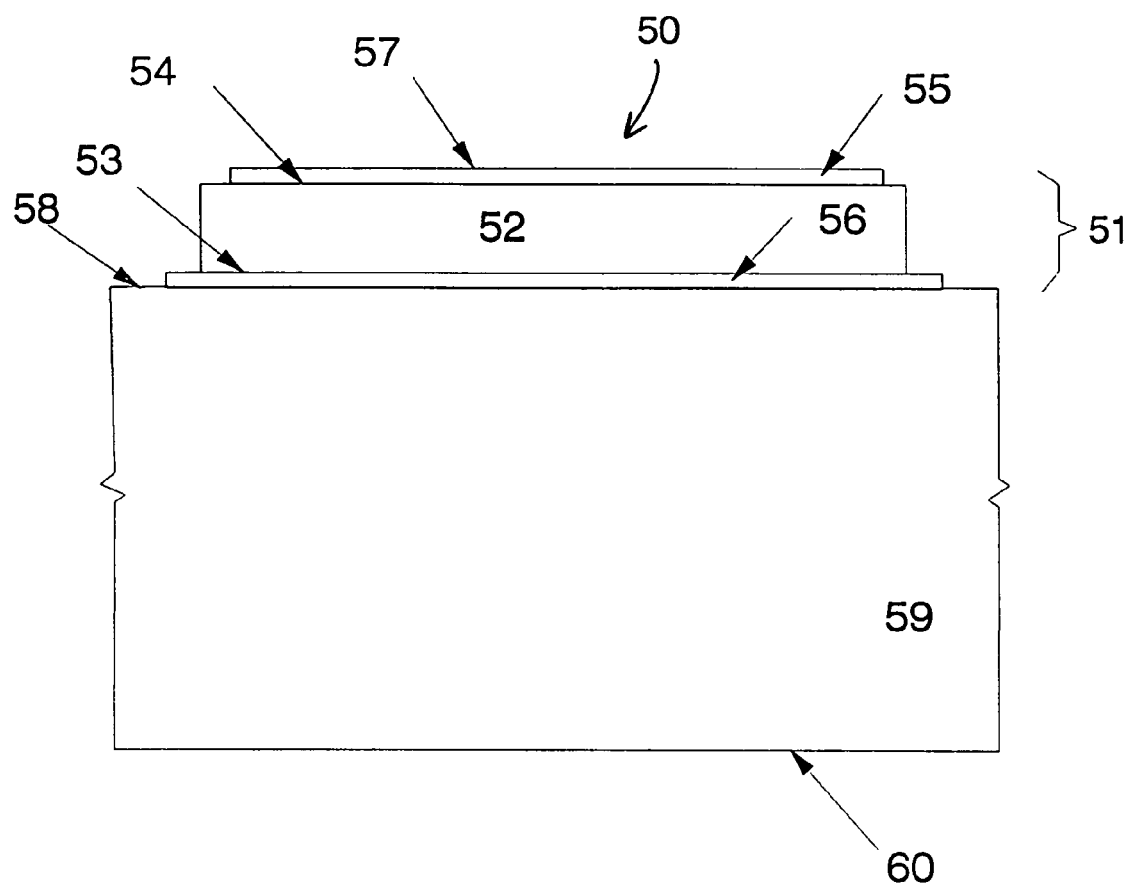
Figure 2:
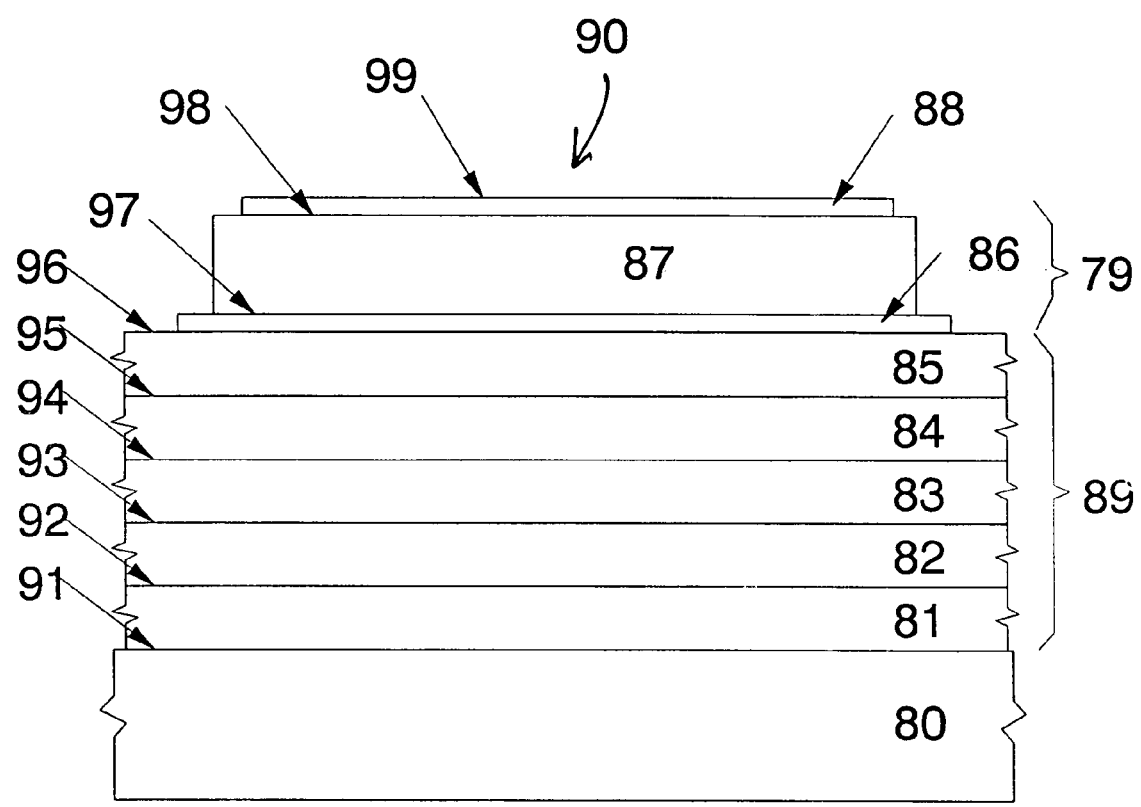
FIG. 2 pictorially illustrates, not-to-scale, another prior art resonator device that is solidly mounted on the surface, and acoustically isolated from, a substrate.
Figure 3:
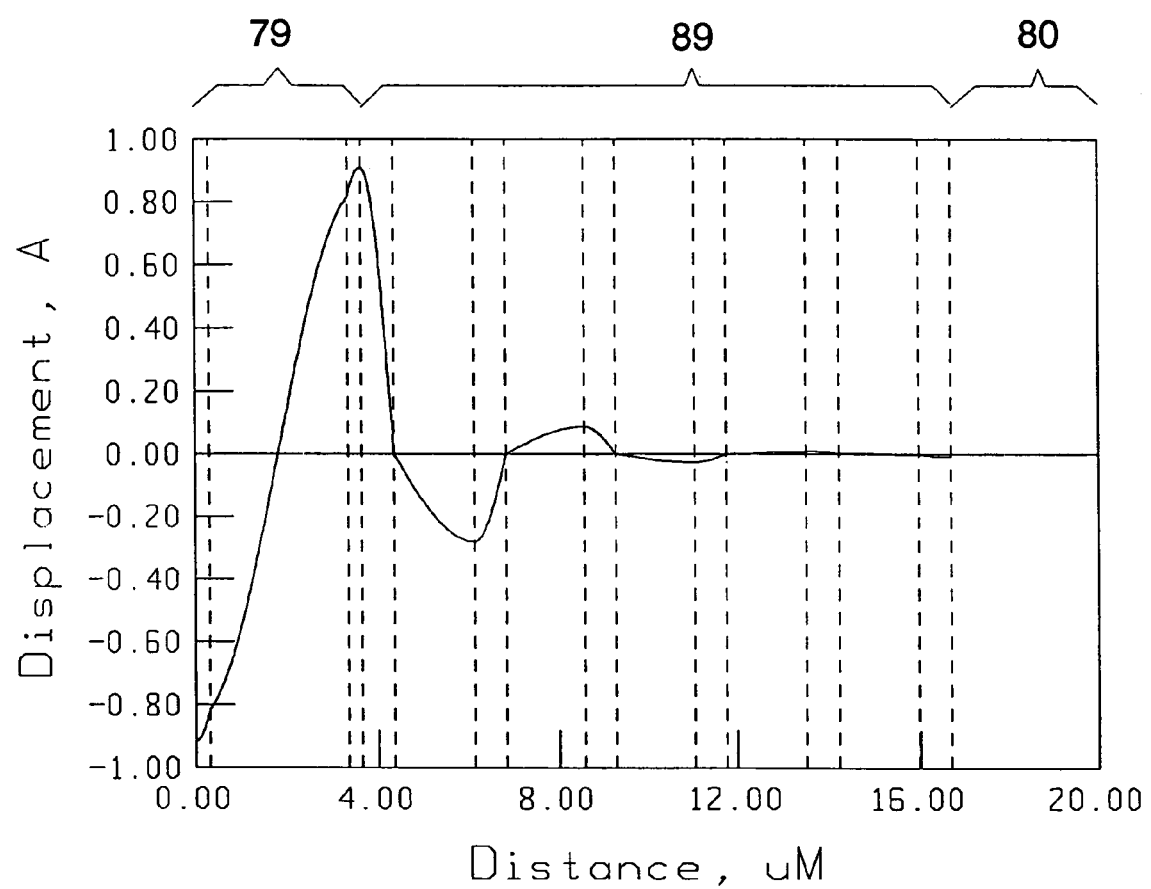
FIG. 3 is a chart that illustrates the amplitude of the acoustic vibrations at resonance of the surface mounted resonator device of FIG. 2 as a function of depth or distance into the device.
Figure 4:
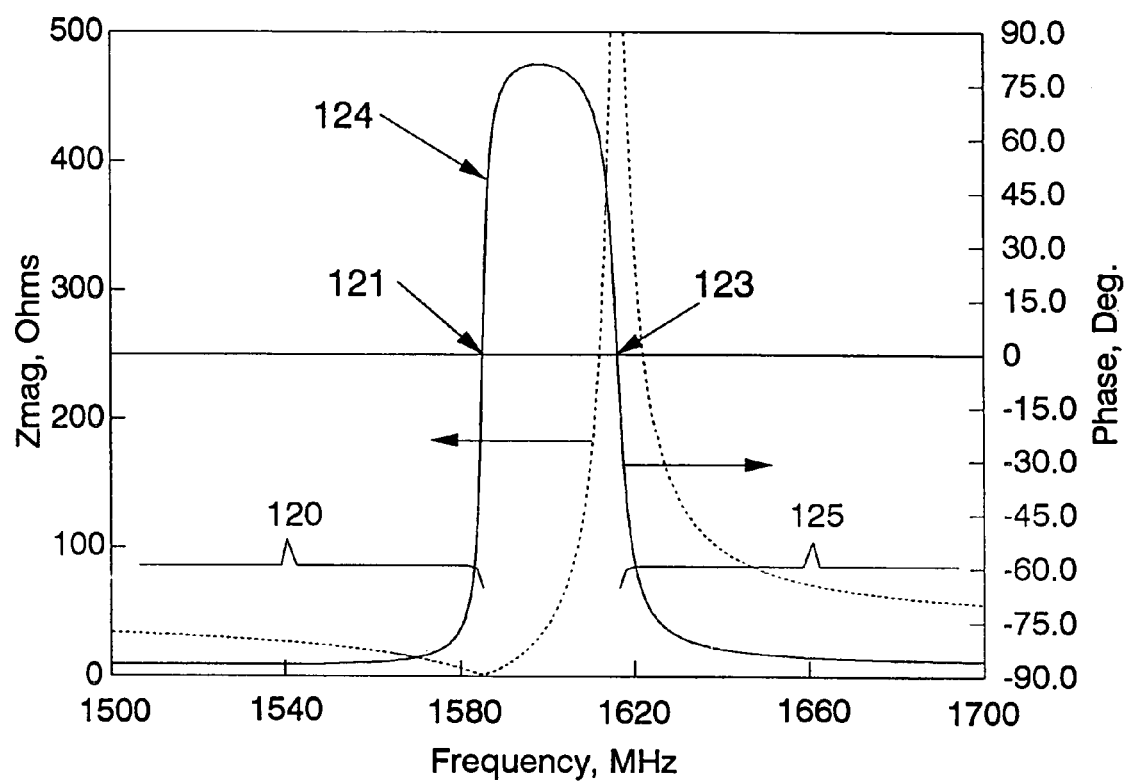
FIG. 4 is a chart that illustrates the phase and magnitude of the electrical input impedance of the prior art resonator device of FIG. 2
Figure 13A:
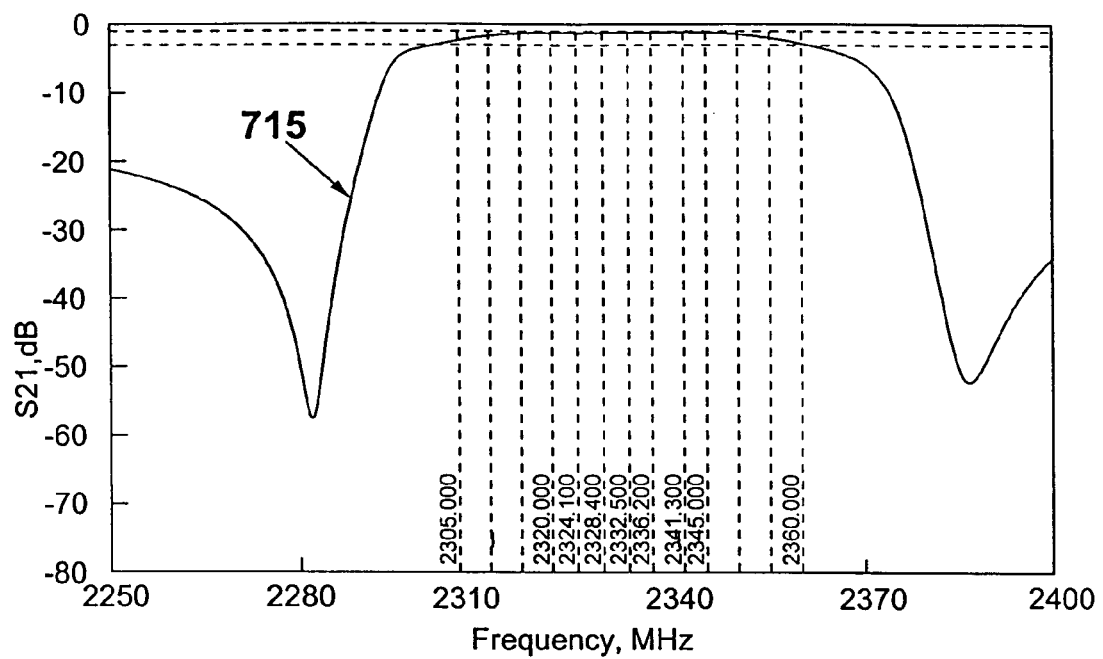
FIG. 13a is a chart covering the frequency range of interest presented in FIG. 12 that shows the typical frequency response of a ladder filter that employs prior art resonator devices.
Figure 13B:
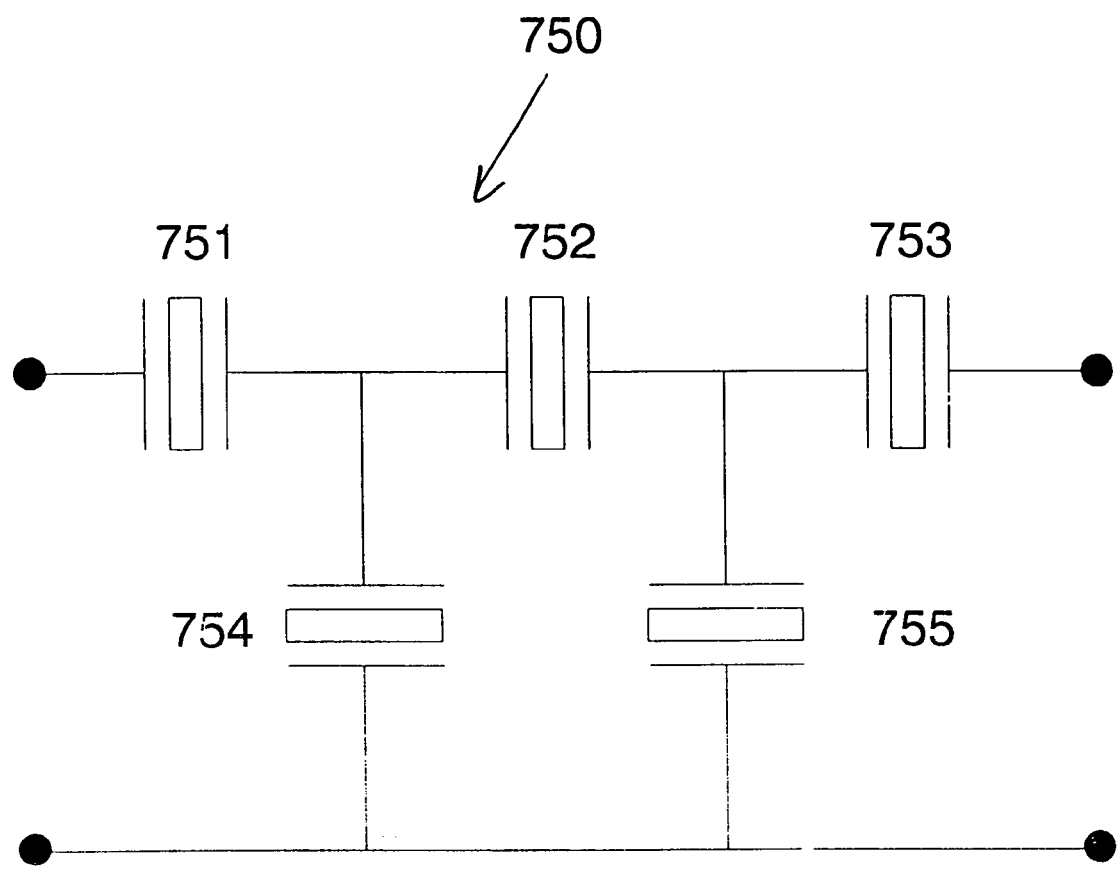
FIG. 13b is a schematic diagram of a ladder filter that can incorporate either resonators of the prior art or the one-port resonator devices of the invention.
Figure 14:
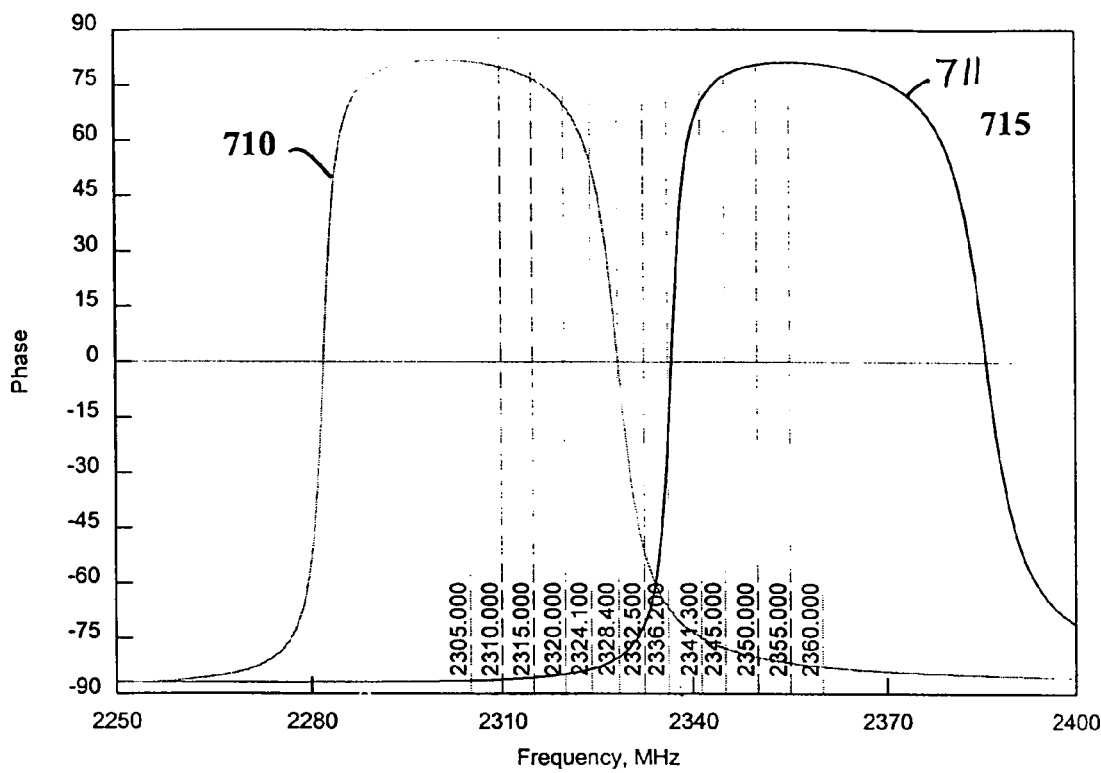
FIG. 14 is a calculated chart of the typical phase response of the series and shunt resonators of the typical ladder filter of FIGS. 13a and 13b.

The filter response for a ladder filter formed of prior art resonators is shown in FIG. 13a, and the pass-band of that response encompasses all of bands 701, 702, 703 and 704, provides no rejection of bands 703 and 704 and provides only a modest level of rejection outside of these bands. Filter 750, shown in FIG. 13b is called a ladder configuration (the "ladder filter") and is composed of series resonator devices 751, 752, and 753 and shunt resonator devices 754 and 755, connected as illustrated. As shown in FIG. 14, the individual resonator devices are designed to have phase responses 710 for resonator devices 754 and 755 and phase responses 711 for resonator devices 751, 752, and 753. At this stage of the design process, the individual resonator devices contained in the ladder filter may be of the prior-art type shown in FIG. 2, in which case the ladder filter may be referred to as a prior art filter. When the filter is formed of the new resonator devices of the invention, the ladder filter also constitutes a new invention from applicant's perspective.

The broad frequency response of the filter of FIG. 13a, which employs prior art resonator devices, clearly fails to meet the requirements of the desired filter that was specified in the next-to-last-paragraph preceding this one. In order to obtain a filter that contains the two passbands desired and a rejection band located between the two passbands, the ladder filter of FIG. 13b can instead be constructed of dual-frequency resonator devices that have the configuration of the embodiment of this invention depicted in FIG. 7.

Figure 15A:
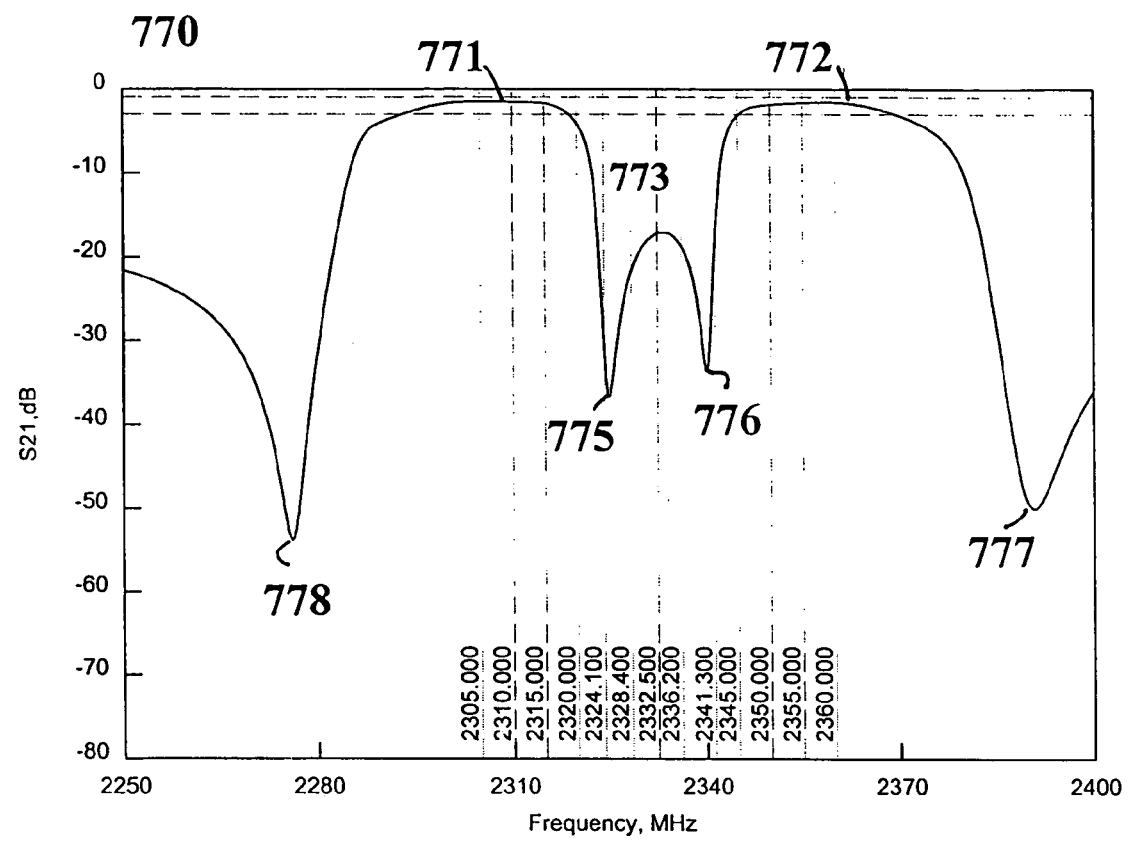
FIG. 15a is a chart showing the calculated filter response of a ladder filter incorporating the resonator devices of the invention described in a design example.

By analyses of successive trial configurations using the methods referred to in the background to this specification and by successive adjustments of the device parameters, the ladder filter response of FIG. 15a is obtained using dual-frequency resonator devices as single port elements of the ladder filter. The filter parameters can be optimized using educated guesses based on experience to adjust parameters or by using Monte Carlo or similar techniques to select appropriate adjustments to the parameters. The dual-frequency resonators are used as both the series and the shunt elements of the ladder filter. As described further hereafter, the properties of the shunt resonator devices of the filter, however, are shifted slightly lower in frequency relative to the series resonator devices by the addition to the shunt elements of shift layer 466 depicted in FIG. 17. Filter response 770, illustrated in FIG. 15a, is composed of passbands 771 and 772 and an intermediate rejection band 773 with transmissibility dips at 778, 775, 776 and 777. In contrast to the prior art filter of FIG. 13a, filter response 770 exhibits the desired pass-band and stop-band properties.

Figure 15B:
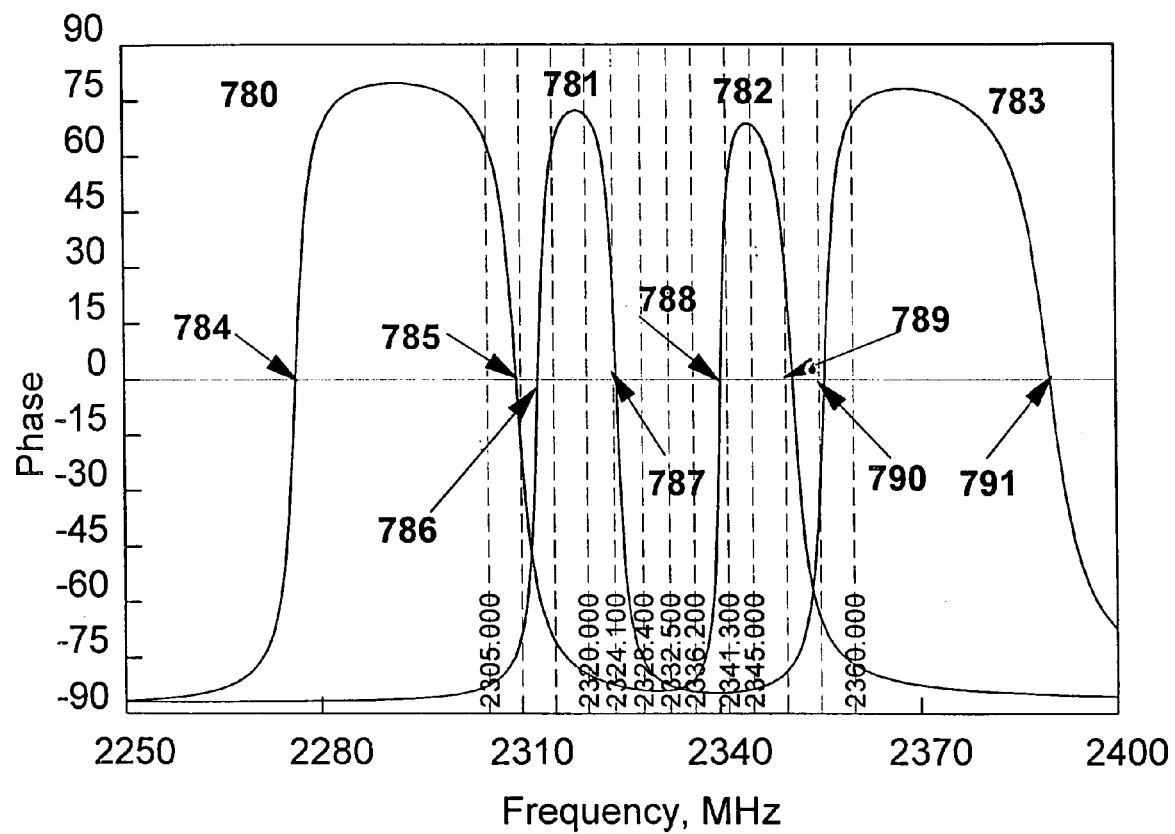
FIG. 15b is the corresponding chart of phase response of the series and shunt resonator devices discussed in connection with FIG. 15b.

Phase responses for the dual-frequency resonator devices are shown in FIG. 15b. Shunt resonator devices 754 and 755 of the ladder filter of FIG. 13b now have a phase response that is composed of wide bandwidth resonance 780, between 784 and 785, followed at a higher frequency by narrower response 782, between resonances 788 and 789, in contrast to the single resonance, 710 in FIG. 14, of the prior art resonators. In more detail, series resonance 784 (FIG. 15b) in shunt resonator devices 754 and 755 provide low impedance to ground, which produces the attenuation's at 778 (FIG. 15a), and, similarly, series resonance 788 (FIG. 15b) produces the desired null at 776 (FIG. 15a). Parallel resonance of shunt resonator devices 754 and 755 at frequency 785 (FIG. 15b) enhance filter response inside lower passband 771 (FIG. 15a) and parallel resonance 789 (FIG. 15b) enhances passband 772 (FIG. 15a) by limiting current flow to ground.

Series resonator devices 751, 752, and 753 of the ladder filter of FIG. 13b now have a narrow bandwidth response 781, as illustrated in FIG. 15b, between resonances at 786 and 787, followed at a higher frequency by a wide bandwidth response 783, between resonances 790 and 791, in contrast to the simple phase response 711 of FIG. 14 of the prior art resonator. In further detail, series resonance 786 enhances the transmission near the high frequency corner of filter band 771 and series resonance 790 enhances the transmission in pass band 772. Parallel resonance at 787 decreases transmission to produce the null at frequency 775 and resonance 791 produces the outer attenuation 777.

Figure 17:
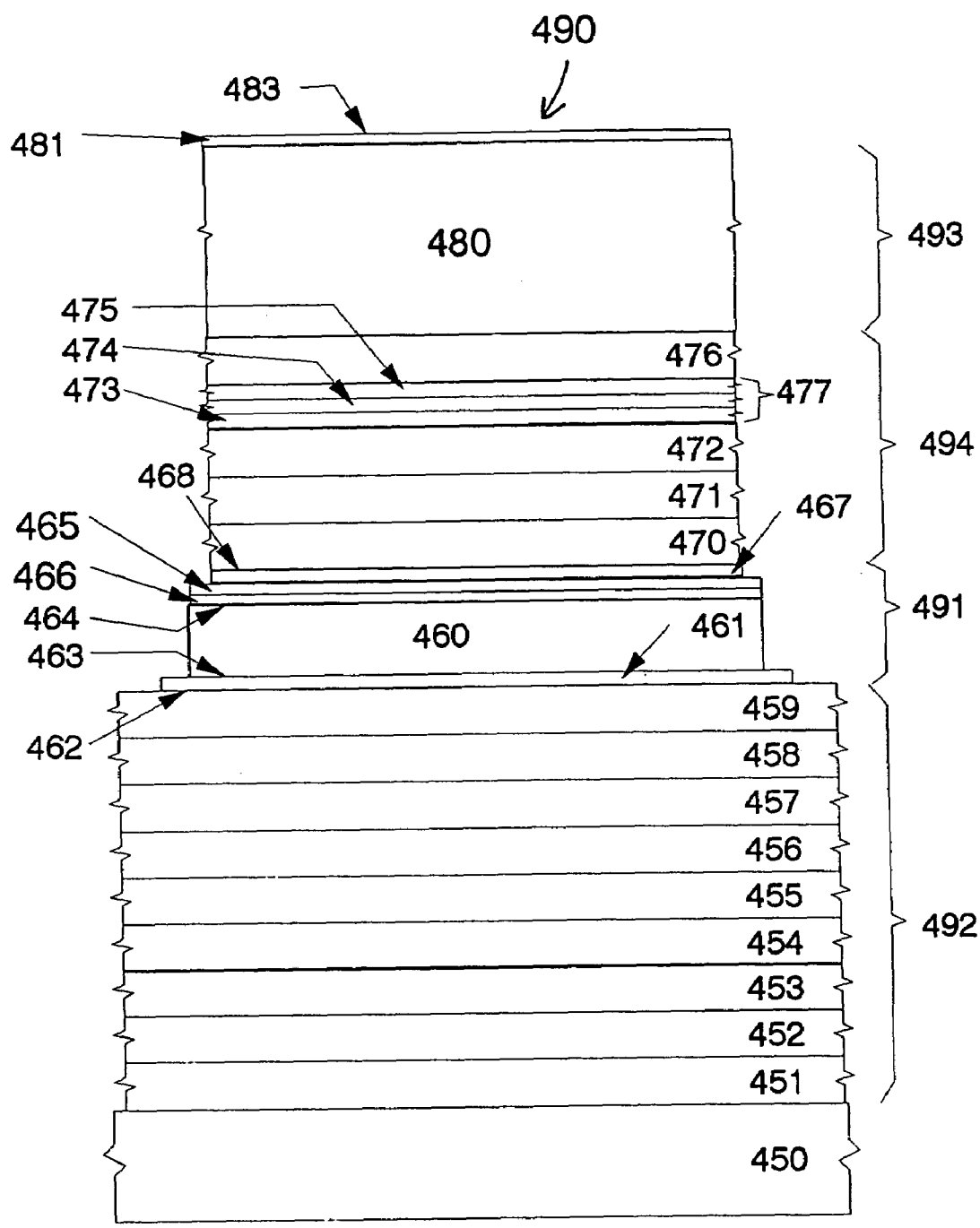
FIG. 17 pictorially illustrates, not-to-scale, the resonator device used in the example of the ladder filter design described in FIGS. 13b, 15a and 15b.

FIGS. 16 and 17 present details for the resonator device for the foregoing ladder filter. Reflector 492, which functions as an acoustic isolator, is formed of nine nominally quarter-wavelength thick layers, 451 through 459, formed on top of substrate 450. Those layers are composed of a sequence of Silicon Dioxide ("SiO$_2$") layers 451, 453, 455, 457 and 459, each of which is 0.6350 μm thick, and AlN (layers 452, 454, 456 and 458 each of which is 1.1800 μm thick). In this specific embodiment, substrate layer 450 is formed of Silicon. Transducer/resonator 491, including electrodes 461 and 467, is formed on top of reflector 492. On top of transducer/resonator 491 is a shunt resonator shift layer 466 and then a cap layer 465 (both of which are described further below). That cap layer protects the underlying layers from the etching process that is used to pattern the upper electrode 467 of transducer 491.

In the practical embodiment illustrated in FIG. 16, piezoelectric layer 460 of the transducer is formed of AlN and is 1.9530 μm thick, bottom electrode layer 461 is aluminum and is 0.2200 μm thick, shift layer 466 (described below) is formed of SiO$_2$ and is 0.0660 μm thick, cap layer 465 (also described further below) is formed of silicon nitride and is 0.0100 μm thick and electrode layer 467 is formed of aluminum and is 0.2200 μm thick.

Acoustic coupler 494 consists of quarter wavelength AlN and SiO$_2$ layers that are alternated in the stack with the exception of composite layer 477, which layer is a composite of layers of SiO$_2$, 473, tungsten ("W"), 474, and SiO$_2$, 475 configured to form an effective acoustic quarter-wavelength thick composite layer having an effective mechanical impedance intermediate between that of W and SiO$_2$. It is this latter composite layer 477 that is used to obtain the desired amount of coupling between transducer 491 and resonator 493. In this specific embodiment, the coupler layers 470, 472 and 476 are formed of SiO$_2$ and are 0.6450 μm thick, layers 473 and 475 are also formed of SiO$_2$ and are 0.0750 μm thick and layer 474 is formed of W and is 0.2000 μm thick.

Mechanical resonator layer 493 is located above acoustic coupler 494 and is formed of a layer of high Q material and layer 481. Layer 481, referred to as the trimmer layer, is made of a material that is easily etched or ion-machined. In the specific embodiment layer 480 is formed of AlN and is 2.3300 μm thick and the tuning layer 481 is formed of SiO$_2$ and is 0.0200 μm thick.

Layers 473, 474 and 475 of acoustic coupler 494 combine to synthesize a composite quarter wavelength layer that has an effective impedance that lies between those impedance levels that could be provided by either a layer of tungsten or by a layer of silicon dioxide. Shift layer 466 is only used on the shunt resonators that appear in the ladder filter (see FIG. 13b). The shift layer lowers by a small amount the frequencies of the acoustic resonances exhibited by shunt resonator devices 754 and 755 relative to those resonances of series resonator devices 751, 752 and 753 and also interchanges the relative width of the two phase excursions exhibited by each input impedance of each shunt resonator. The cap layer 465 is an etch protection layer that protects the underlying layers from the metal etch used in processing. Tuning layer 481 on mechanical resonator 493 can be ion-milled to reduce the thickness and shift the resonant frequency of the mechanical resonator.

In this example, the mechanical resonator's acoustic resonant frequency is located between the resonance frequencies of the prior art resonator responses 710 and 711 in FIG. 14. Thus, the narrower resonance 781 shown in FIG. 15b is on the higher frequency side of response 780. Because the acoustic resonant frequency of the mechanical resonator is lower in frequency than the prior art resonator response 711, narrow response 783 (in FIG. 15b) is on the lower frequency side at 782. This is a consequence of the acoustic resonant frequency of the transducer/resonator being offset from the acoustic resonant frequency of the mechanical resonator. Because the mechanical resonator is lightly coupled to the transducer/resonator, the narrower responses 781 and 782 can be attributed to the mechanical resonator.

It should be apparent that although the invention has been described in terms of being fabricated in steps from top to bottom, the layers of the device could, instead, be fabricated in some other order.

The filter design procedure is to first obtain resonator and filter simulated responses close to what is desired in the final filter by using prior art single resonance resonator devices. Next the mechanical resonator is added to the structure being analyzed in such a way that the acoustic coupling between the mechanical resonator and the transducer/resonator is light. This produces a very narrow resonance null in the filter passband without disturbing most of the filter passband and allows for proper location of the mechanical resonator's acoustic resonant frequency. Parameters in the coupler, such as layer impedances or number of layers are then modified to increase the acoustic coupling between the transducer/resonator and the mechanical resonator. As acoustic coupling is increased, the spacing between the two passbands in the ladder filter changes. The location of the attenuation region between the two passbands is controlled primarily by the mechanical resonator's acoustic resonant frequency.

Because of the narrow bandwidth requirements of this example of frequency filter, it is necessary to provide a degree of temperature compensation. This can be accomplished by the use of offsetting temperature coefficient materials in the mechanical resonator and the acoustic coupler.

The above description of the invention focused on dual frequency resonator devices although the concept allows for resonator devices which would include additional mechanical resonators within the device.

The resonator device of FIG. 5 can be fabricated on a suitable substrate and the region of the substrate immediately under the resonator removed to expose resonator 203. This manufacturing technique would allow transducer/resonator 201 and mechanical resonator 203 to be tuned independently, one from the top side of the wafer the other from the bottom side of the wafer through the hole etched in the substrate, a preferred manner for providing dual tuning procedures in the device.

It is believed that the foregoing description of the preferred embodiments of the invention is sufficient in detail to enable one skilled in the art to make and use the invention without undue experimentation. However, it is expressly understood that the detail of the elements comprising the embodiment presented for the foregoing purpose is not intended to limit the scope of the invention in any way, in as much as equivalents to those elements and other modifications thereof, all of which come within the scope of the invention, will become apparent to those skilled in the art upon reading this specification. Thus, the invention is to be broadly construed within the full scope of the appended claims.

What is claimed is:

1. A single-port acoustic resonator device having an input impedance at said port that exhibits at least one electrical resonance within a prescribed frequency band, said prescribed frequency band having a bandwidth that is less than one-half of a central frequency located at the center of said prescribed frequency band, said resonator device comprising:

a transducer/resonator comprising a layer of piezoelectric material, a first electrode layer comprising an electrically conducting material and a second electrode layer comprising an electrically conducting material, said layer of piezoelectric material being situated between said first electrode layer and said second electrode layer, and said transducer/resonator exhibiting an acoustic resonance within said prescribed frequency band;

a mechanical resonator comprising at least one layer of a solid acoustically conductive material, said mechanical resonator exhibiting an acoustic resonance within said prescribed frequency band;

an acoustic coupler, said acoustic coupler comprising at least one layer of a solid acoustically conductive material, said acoustic coupler being physically situated between said transducer/resonator and said mechanical resonator for acoustically coupling said transducer/resonator with said mechanical resonator, said transducer/resonator, said acoustic coupler and said mechanical resonator further comprising a stacked integral assembly.

2. The single port acoustic resonator device as defined in claim 1, further comprising:

a substrate for supporting said stacked integral assembly of said transducer/resonator, said acoustic coupler and said mechanical resonator; and an acoustic isolator;

said acoustic isolator used for substantially inhibiting coupling of acoustic energy to said substrate from any of said transducer/resonator, said mechanical resonator, and said acoustic coupler.

3. The single port acoustic resonator device as defined in claim 2, wherein said substrate and said acoustic isolator are formed in a stacked relationship with said acoustic isolator overlying said substrate and underlying said stacked integral assembly and integrally attached thereto.

4. The single port acoustic resonator device as defined in claim 3, wherein said mechanical resonator is located at a distal end of said stacked integral assembly for permitting access thereto, and wherein said transducer/resonator is located at the proximal end of said stack and is contiguous with an outer surface of said acoustic isolator.

5. The single-port acoustic resonator device as defined in claim 1, wherein said acoustic resonance exhibited by said transducer/resonator comprises a bulk wave acoustic resonance and wherein said acoustic resonance exhibited by said mechanical resonator comprises a bulk wave acoustic resonance.

6. The single port acoustic resonator device as defined in claim 1, wherein said input impedance at said port exhibits at least two electrical resonances within said prescribed frequency band.

7. The single port acoustic resonator device as defined in claim 1, wherein said mechanical resonator further comprises a trimmer layer, said trimmer layer including a layer of solid acoustic energy conductive material having a major surface that is physically accessible.

8. The single port acoustic resonator device as defined in claim 7, wherein said trimmer layer possesses a thickness dimension, said thickness dimension being formed by reduction from a greater thickness dimension by means of etching, ion milling or otherwise to obtain a desired frequency of resonance for said mechanical resonator.

9. The single port acoustic resonator device as defined in claim 7, wherein said trimmer layer possesses a thickness dimension, said thickness dimension being formed by enhancement of a lesser thickness dimension by deposition of additional solid material to obtain a desired frequency of resonance for said mechanical resonator.

10. The single port acoustic resonator device as defined in claim 7, and further comprising a cap layer and a shift layer, wherein said first and second electrode layers are of Al and are 0.2200 μm thick;

said cap layer comprises Si3N4 for protecting underlying layers from metal etchant, and is 0.0100 μm thick;

said shift layer comprises SiO$_2$ and is 0.0660 μm thick;
said piezoelectric layer comprises AlN and is 1.9530 μm thick;
said trimmer layer comprises SiO$_2$ is 0.0200 μm thick;
said trimmer layer being located on the outside surface of said mechanical resonator and is accessible for ion milling;
said mechanical resonator comprises AlN and is 2.3300 μm thick.

11. The single port acoustic resonator device as defined in claim 1 wherein said mechanical resonator further comprises a first layer of solid acoustically conductive material, the first layer of material having a temperature coefficient for its acoustic phase to at least partially offset the temperature coefficient of the acoustic phase velocity of other layers of said mechanical resonator thus inhibiting change in resonant frequency of said mechanical resonator due to a change in temperature.

12. The single port acoustic resonator device as defined in claim 1, wherein said transducer/resonator possesses a thickness dimension that is approximately equal to one-half of an acoustic wavelength (or an integral multiple thereof) at a frequency within said prescribed frequency band; and wherein said mechanical resonator possesses a thickness dimension that is approximately equal to one-half of an acoustic wavelength (or an integral multiple thereof) at a frequency within said prescribed frequency band.

13. The single port acoustic resonator device as defined in claim 1, and wherein said acoustic coupler comprises at least one layer of material having a thickness approximately equal to one-quarter acoustic wavelength or an odd-integral multiple thereof at a frequency within said prescribed frequency band.

14. The single-port acoustic resonator device as defined in claim 1, wherein said acoustic coupler comprises a plurality of layers of solid sound conductive material, said plurality of layers of solid sound conductive material having a combined thickness approximately equal to an integral multiple of one-quarter acoustic wavelengths at a frequency within said prescribed frequency band and wherein at least one of said layers in said plurality of layers comprises a thickness dimension that exceeds one-quarter of an acoustic wavelength at said frequency within said prescribed frequency band.

15. The single port acoustic resonator device as defined in claim 14, wherein said plurality of layers in said acoustic coupler further comprises first, second, third and fourth layers and wherein said second through fourth layers of said acoustic coupler collectively possess an effective impedance between the impedance of W (tungsten) and the impedance of SiO$_2$.

16. The single port acoustic resonator device as defined in claim 1, wherein said transducer/resonator further comprises a first layer of solid acoustically conductive material having an acoustic phase velocity having a positive temperature coefficient and a second layer of acoustically conductive material having an acoustic phase velocity having a negative temperature coefficient that at least partially offsets the change in acoustic phase velocity of the first layer due to change in temperature.

17. The single port acoustic resonator device as defined in claim 1, wherein said acoustic coupler further comprises:
alternating layers of SiO$_2$ and AlN arranged in a stack.

18. A frequency filter, comprising:
an input port and an output port and a ground,
first, second and third acoustic resonator devices connected in series between said input and output ports,
fourth and fifth resonator devices;
said fourth resonator device connected to the serial connection between said first and second acoustic resonator devices and extending in shunt thereof to ground;
said fifth resonator device connected to the serial connection between said second and third acoustic resonator devices and extending in shunt thereof to ground;
each of said first through fifth acoustic resonator devices, further comprising:
a single-port acoustic resonator device having an input impedance at said port that exhibits at least one electrical resonance within a prescribed frequency band, said prescribed frequency band having a bandwidth that is less than one-half of a central frequency located at the center of said prescribed frequency band, said acoustic resonator device comprising:
a transducer/resonator comprising:
a layer of piezoelectric material,
a first electrode layer comprising an electrically conducting material and
a second electrode layer comprising an electrically conducting material,
said layer of piezoelectric material being situated between said first electrode layer and said second electrode layer, and said transducer/resonator exhibiting an acoustic resonance within said prescribed frequency band;
a mechanical resonator comprising at least one layer of a solid acoustically conductive material, said mechanical resonator exhibiting an acoustic resonance within said prescribed frequency band;
an acoustic coupler, said acoustic coupler comprising at least one layer of a solid acoustically conductive material, said acoustic coupler being physically situated between said transducer/resonator and said mechanical resonator for acoustically coupling said transducer/resonator with said mechanical resonator,
said transducer coupler, said acoustic coupler and said mechanical resonator further comprising a stacked integral assembly.

* * * * *